US012560556B2

(12) United States Patent
Meng et al.

(10) Patent No.: US 12,560,556 B2
(45) Date of Patent: Feb. 24, 2026

(54) METHOD AND SYSTEM OF SAMPLE EDGE DETECTION AND SAMPLE POSITIONING FOR IMAGE INSPECTION APPARATUS

(71) Applicant: ASML Netherlands B.V., Veldhoven (NL)

(72) Inventors: Xiaodong Meng, San Jose, CA (US); Zhiwen Kang, San Jose, CA (US); Jian Zhang, San Jose, CA (US); Kangsheng Qiu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 190 days.

(21) Appl. No.: 18/686,369

(22) PCT Filed: Aug. 3, 2022

(86) PCT No.: PCT/EP2022/071819
§ 371 (c)(1),
(2) Date: Feb. 23, 2024

(87) PCT Pub. No.: WO2023/030814
PCT Pub. Date: Mar. 9, 2023

(65) Prior Publication Data
US 2024/0402093 A1      Dec. 5, 2024

Related U.S. Application Data

(60) Provisional application No. 63/240,625, filed on Sep. 3, 2021.

(51) Int. Cl.
*G01N 21/95*        (2006.01)
*G01B 11/02*        (2006.01)
(Continued)

(52) U.S. Cl.
CPC ....... *G01N 21/9503* (2013.01); *G01B 11/028* (2013.01); *G01N 21/8806* (2013.01); (Continued)

(58) Field of Classification Search
CPC ............... G01N 23/22; G01N 23/2258; G01N 21/9501; G01N 21/9505; G01N 21/8851; (Continued)

(56) References Cited

U.S. PATENT DOCUMENTS

| | | | |
|---|---|---|---|
| 9,377,416 B2 | 6/2016 | Maleev et al. | |
| 2009/0153868 A1* | 6/2009 | Sawabe | B23K 26/0665 |
| | | | 356/445 |

(Continued)

FOREIGN PATENT DOCUMENTS

| | | | | |
|---|---|---|---|---|
| EP | 2339331 A1 * | 6/2011 | .......... | H01L 21/681 |
| TW | 201830340 A | 8/2018 | | |
| WO | WO-2020163644 A1 * | 8/2020 | .......... | H01L 21/681 |

OTHER PUBLICATIONS

PCT International Search Report, corresponding with a PCT Application No. PCT/EP2022/071819, mailed on Dec. 6, 2022. (3 pages).
(Continued)

*Primary Examiner* — Michael P Stafira
(74) *Attorney, Agent, or Firm* — Finnegan, Henderson, Farabow, Garrett & Dunner, LLP

(57)        ABSTRACT

Systems, apparatuses, and methods for detecting a location of a positioned sample may include an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined
(Continued)

range of wavelengths, the second wavelength is outside the predetermined range of wavelengths, and the first brightness is higher than the second brightness; a light source configured to direct the light at the gap area; and an optical detector configured to image the light reflected off the gap area.

20 Claims, 13 Drawing Sheets

(51) Int. Cl.
  *G01N 21/88* (2006.01)
  *G03F 7/00* (2006.01)
(52) U.S. Cl.
  CPC ....... *G01N 21/8851* (2013.01); *G03F 7/7065* (2013.01); *G01B 2210/56* (2013.01); *G01N 2021/8845* (2013.01); *G01N 2021/8848* (2013.01); *G01N 2021/8887* (2013.01)
(58) Field of Classification Search
  CPC ..... G01N 2021/845; G01N 2021/8887; G01N 2021/8896; G01N 21/3504; G01N 33/0095; G01N 2021/3144; G01N 2021/3568; G01N 2021/3595; G01N 21/01; G01N 21/211; G01N 21/31; G01N 21/3563; G01N 21/8422; G01N 21/9503; G01N 2223/076; G01N 23/223; G01N 27/00; G01N 27/002; G01N 27/041; G01N 2021/8822; G01N 2021/8874; G01N 21/47; G01N 21/6489; G01N 21/8806; G01N 21/94; G01N 21/95607; G01N 2201/06113; G01N 2291/0234; G01N 2291/0289; G01N 2291/0421; G01N 2291/106; G01N 27/07; G01N 29/04; G01N 29/262; G01N 29/30; G01N 33/00; G02B 2006/12104; G02B 6/4206; G02B 27/0037; G02B 27/4238; G02B 27/4277; G02B 6/12; G02B 6/43; G02B 7/025; G02B 2006/12107; G02B 6/12004; G02B 6/124; G02B 6/30; G02B 6/34; G02B 6/4204; G02B 6/4214; G02B 6/4244; G02B 6/4245; G01B 11/14; G01B 2210/56; G01B 11/06; G01B 15/00; G01B 15/04; G01B 11/002; G01B 11/02; G01B 11/0608; G01B 11/065; G01B 11/2441; G01B 15/045; G01B 7/08; G01B 11/00; G01B 11/16; G01B 11/24; G01B 11/26; G01B 11/272; G01B 21/00; G01B 21/02; G01B 21/18; G01B 9/02015

See application file for complete search history.

(56) References Cited

U.S. PATENT DOCUMENTS

| | | | |
|---|---|---|---|
| 2010/0124610 A1* | 5/2010 | Aikawa | C23C 16/4584 |
| | | | 118/712 |
| 2019/0101839 A1 | 4/2019 | Janda et al. | |
| 2020/0075368 A1* | 3/2020 | Potter | H01L 21/67259 |
| 2021/0172728 A1* | 6/2021 | Waqar | H01L 22/12 |
| 2022/0082445 A1* | 3/2022 | Cong | G01J 5/0007 |

OTHER PUBLICATIONS

Keyence, "Self-contained Photoelectric Sensors PZ2 Series", an online guide retrieved from www.sensorcentral.com, Technical Guide p. 754 (2 pages).

* cited by examiner

300

400A

400B

700

900

1000A

1000B

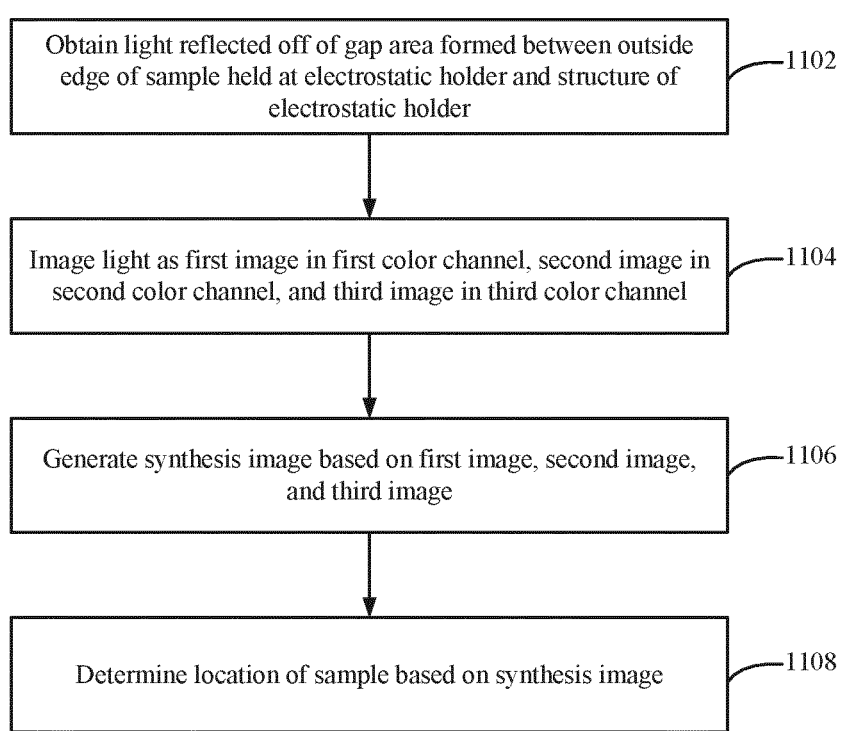

1100

Obtain light reflected off of gap area formed between outside edge of sample held at electrostatic holder and structure of electrostatic holder ——1102

Image light as first image in first color channel, second image in second color channel, and third image in third color channel ——1104

Generate synthesis image based on first image, second image, and third image ——1106

Determine location of sample based on synthesis image ——1108

Apply mechanical milling process to surface of gap area formed
between outside edge of sample held at electrostatic holder and
structure of electrostatic holder    ⎯1202

FIG. 12

METHOD AND SYSTEM OF SAMPLE EDGE DETECTION AND SAMPLE POSITIONING FOR IMAGE INSPECTION APPARATUS

CROSS-REFERENCE TO RELATED APPLICATIONS

This application claims priority to International Application No. PCT/EP2022/071819, filed 3 Aug. 2022, and published as WO2023030814 A1, which claims priority of U.S. application 63/240,625 which was filed on 3 Sep. 2021. The contents of these applications are incorporated herein by reference in their entireties.

FIELD

The description herein relates to the field of image inspection apparatus, and more particularly to sample edge detection and sample positioning for image inspection apparatuses.

BACKGROUND

An image inspection apparatus (e.g., a charged-particle beam apparatus or an optical beam apparatus) is able to produce a two-dimensional (2D) image of a sample (e.g., a wafer substrate or simply referred to as a "wafer") by detecting particles (e.g., photons, secondary electrons, back-scattered electrons, mirror electrons, or other kinds of electrons) from a surface of a sample upon impingement by a beam (e.g., a charged-particle beam or an optical beam) generated by a source (e.g., a charged-particle source or a light source) associated with the inspection apparatus. Various image inspection apparatuses are used on semiconductor wafers in semiconductor industry for various purposes such as wafer processing (e.g., e-beam direct write lithography system), process monitoring (e.g., critical dimension scanning electron microscope (CD-SEM)), wafer inspection (e.g., e-beam inspection system), or defect analysis (e.g., defect review SEM, or say DR-SEM and Focused Ion Beam system, or say FIB).

For image inspection apparatuses, positioning of the to-be-inspected sample is important for a high successful rate of sample alignment and sample inspection. Various existing methods may be used for sample positioning. One method is to take images (e.g., optical images) that cover an outer edge of the sample (e.g., a wafer edge) and an inner edge of a sample holder (e.g., an electrostatic holder edge) that holds the sample. After obtaining the images, an image processing algorithm may be applied to detect the outer edge of the sample and the inner edge of the sample holder. Based on the outer edge of the sample and the inner edge of the sample holder, a position of the sample may be determined.

SUMMARY

Embodiments of the present disclosure provide systems and methods for detecting a location of a positioned sample.

In some embodiments, an apparatus for detecting a location of a positioned sample may include an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined range of wavelengths, the second wavelength is outside the predetermined range of wavelengths, and the first brightness is higher than the second brightness. The apparatus may also include a light source configured to direct the light at the gap area. The apparatus may further include an optical detector configured to image the light reflected off the gap area.

In some embodiments, another apparatus for detecting a location of a positioned sample may include an electrostatic holder configured to hold a sample and form a gap area between an outside edge of the sample and a structure of the electrostatic holder when the electrostatic holder holds the sample, wherein a surface of the gap area is applied with a mechanical milling process. The apparatus may also include a light source configured to direct the light at the gap area. The apparatus may further include an optical detector configured to image the light reflected off the gap area.

In some embodiments, a system may include an image inspection apparatus configured to scan a sample positioned on a sample holder and generate an image of the sample. The system may also include an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined range of wavelengths, the second wavelength is outside the predetermined range of wavelengths, and the first brightness is higher than the second brightness. The system may further include a light source configured to direct the light at the gap area with a predetermined polarity. The system may further include an optical detector configured to image the light reflected off the gap area, wherein brightness of the first wavelength of the imaged light is higher than brightness of the second wavelength of the imaged light.

In some embodiments, another system may include an image inspection apparatus configured to scan a sample positioned on a sample holder and generate an image of the sample. The system may also include an electrostatic holder configured to hold a sample and form a gap area between an outside edge of the sample and a structure of the electrostatic holder when the electrostatic holder holds the sample, wherein a surface of the gap area is applied with a mechanical milling process. The system may further include a light source configured to direct the light at the gap area with a predetermined polarity. The system may further include an optical detector configured to image the light reflected off the gap area.

In some embodiments, a method for detecting a location of a positioned sample may include obtaining light reflected off a gap area formed between an outside edge of a sample held at an electrostatic holder and a structure of the electrostatic holder, wherein the gap area is coated with a first coating configured to reflect a first wavelength of light with first brightness, to reflect a second wavelength of the light with second brightness, and to reflect a third wavelength of the light with third brightness, the first wavelength is within a predetermined range of wavelengths, the second wavelength and the third wavelength are outside the predetermined range of wavelengths, and the first brightness is higher than the second brightness and the third brightness. The method may also include imaging the light as a first image in a first color channel, a second image in a second color channel, and a third image in a third color channel, wherein a first wavelength of the light is imaged in the first color channel, a second wavelength of the light is imaged in the second color channel, and a third wavelength of the light is imaged in the third color channel. The method may further include generating a synthesis image based on the first image, the second image, and the third image. The method may further include determining a location of the sample based on the synthesis image.

In some embodiments, a non-transitory computer-readable medium may store a set of instructions that is executable by at least one processor of an apparatus. The set of instructions may cause the apparatus to perform a method. The method may include causing the apparatus to obtain light reflected off a gap area formed between an outside edge of a sample held at an electrostatic holder and a structure of the electrostatic holder, wherein the gap area is coated with a first coating configured to reflect a first wavelength of light with first brightness, to reflect a second wavelength of the light with second brightness, and to reflect a third wavelength of the light with third brightness, the first wavelength is within a predetermined range of wavelengths, the second wavelength and the third wavelength are outside the predetermined range of wavelengths, and the first brightness is higher than the second brightness and the third brightness. The method may also include causing the apparatus to image the light as a first image in a first color channel, a second image in a second color channel, and a third image in a third color channel, wherein a first wavelength of the light is imaged in the first color channel, a second wavelength of the light is imaged in the second color channel, and a third wavelength of the light is imaged in the third color channel. The method may further include generating a synthesis image based on the first image, the second image, and the third image. The method may further include determining a location of the sample based on the synthesis image.

In some embodiments, a method for manufacturing an electrostatic holder may include applying a mechanical milling process to a surface of a gap area formed between an outside edge of a sample held at an electrostatic holder and a structure of the electrostatic holder, wherein finish conditions of the mechanical milling process comprise at least one of a rotating milling speed greater than or equal to 4000 rounds per minute, a linear feed lower than or equal to two millimeter per second, or a z-axis cutting feed lower than or equal to 0.03 millimeter. The electrostatic holder may be configured for generating an image based on light reflected off the gap area. The electrostatic holder may be further configured for determining a location of the sample based on the image.

BRIEF DESCRIPTION OF THE DRAWINGS

FIG. 11 is a flowchart illustrating an example method for detecting a location of a positioned sample, consistent with some embodiments of the present disclosure.

FIG. 12 is a flowchart illustrating another example method for manufacturing an electrostatic holder, consistent with some embodiments of the present disclosure.

DETAILED DESCRIPTION

Figure 1:
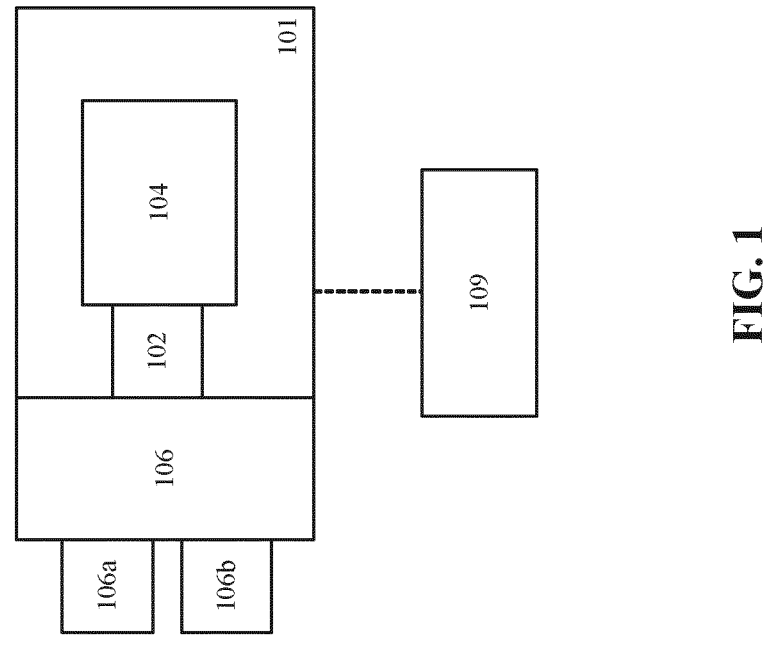
FIG. 1 is a schematic diagram illustrating an example charged-particle beam inspection (CPBI) system, consistent with some embodiments of the present disclosure.

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the subject matter recited in the appended claims. Without limiting the scope of the present disclosure, some embodiments may be described in the context of providing detection systems and detection methods in systems utilizing electron beams ("e-beams"). However, the disclosure is not so limited. Other types of charged-particle beams (e.g., including protons, ions, muons, or any other particle carrying electric charges) may be similarly applied. Furthermore, systems and methods for detection may be used in other imaging systems, such as optical imaging, photon detection, x-ray detection, ion detection, or the like.

Electronic devices are constructed of circuits formed on a piece of semiconductor material called a substrate. The semiconductor material may include, for example, silicon, gallium arsenide, indium phosphide, or silicon germanium, or the like. Many circuits may be formed together on the same piece of silicon and are called integrated circuits or ICs. The size of these circuits has decreased dramatically so that many more of them may be fit on the substrate. For example, an IC chip in a smartphone may be as small as a thumbnail and yet may include over 2 billion transistors, the size of each transistor being less than $\frac{1}{1000}$th the size of a human hair.

Making these ICs with extremely small structures or components is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection may be carried out using a scanning charged-particle microscope ("SCPM"). For example, a scanning charged-particle microscope may be a scanning electron microscope (SEM). A scanning charged-particle microscope may be used to image these extremely small structures, in effect, taking a "picture" of the structures of the wafer. The image may be used to determine if the structure was formed properly in the proper location. If the structure is defective, then the process may be adjusted, so the defect is less likely to recur.

The working principle of a scanning charged-particle microscope (e.g., a SEM) is similar to a camera. A camera takes a picture by receiving and recording intensity of light reflected or emitted from people or objects. A scanning charged-particle microscope takes a "picture" by receiving and recording energies or quantities of charged particles (e.g., electrons) reflected or emitted from the structures of the wafer. Typically, the structures are made on a substrate (e.g., a silicon substrate) that is placed on a platform, referred to as a stage, for imaging. Before taking such a "picture," a charged-particle beam may be projected onto the structures, and when the charged particles are reflected or emitted ("exiting") from the structures (e.g., from the wafer surface, from the structures underneath the wafer surface, or both), a detector of the scanning charged-particle microscope may receive and record the energies or quantities of those charged particles to generate an inspection image. To take such a "picture," the charged-particle beam may scan through the wafer (e.g., in a line-by-line or zig-zag manner), and the detector may receive exiting charged particles coming from a region under charged particle-beam projection (referred to as a "beam spot"). The detector may receive and record exiting charged particles from each beam spot one at a time and join the information recorded for all the beam spots to generate the inspection image. Some scanning charged-particle microscopes use a single charged-particle beam (referred to as a "single-beam SCPM," such as a single-beam SEM) to take a single "picture" to generate the inspection image, while some scanning charged-particle microscopes use multiple charged-particle beams (referred to as a "multi-beam SCPM," such as a multi-beam SEM) to take multiple "sub-pictures" of the wafer in parallel and stitch them together to generate the inspection image. By using multiple charged-particle beams, the SEM may provide more charged-particle beams onto the structures for obtaining these multiple "sub-pictures," resulting in more charged particles exiting from the structures. Accordingly, the detector may receive more exiting charged particles simultaneously and generate inspection images of the structures of the wafer with higher efficiency and faster speed.

For image inspection apparatuses, positioning of a to-be-inspected sample (e.g., a wafer) is important for a higher success rate of sample alignment and sample inspection. Various existing methods may be used for sample positioning. One method is to take images (e.g., optical images) that cover an outer edge of the sample (e.g., a wafer edge) and an inner edge of a sample holder (e.g., an electrostatic holder edge) that holds the sample. After obtaining the images, an image processing algorithm may be applied to detect the outer edge of the sample and the inner edge of the sample holder. Based on the outer edge of the sample and the inner edge of the sample holder, a position of the sample may be determined. As an example, U.S. Pat. No. 9,377,416 illustrates such existing systems and methods for sample positioning.

However, some challenges exist in the existing methods for sample positioning. Typically, an image inspection apparatus may be used to inspect samples provided by different providers. The samples from different providers may have various optical features (e.g., surface reflectivity). Those optical features may be similar to or different from the optical features of the surface of the sample holder, which may have a vast range of variations. Such variations pose difficulties to the image processing algorithm that is applied to detect the outer edge of the sample and the inner edge of the sample holder. For example, if the reflectivity of a sample is very similar to reflectivity of a sample holder, the generated image for edge detection may have similar gray level (i.e., low contrast) for the portion representing the outer edge of the sample and the portion representing the inner edge of the sample holder, in which the image processing algorithm may have a high failure rate of identifying any edges. If the outer edge of the sample and the inner edge of the sample holder are not successfully detected, the location of the sample may be erroneously determined. If the location of the sample is erroneously determined as correct, the sample will not be adjusted to be at the correct location, which may cause errors in the inspection results of the sample due to the non-ideally positioned sample.

To enable the image inspection apparatus to detect edges for samples with such vast range of variations of optical features, embodiments of the present disclosure provide methods, apparatuses, and systems for detecting a location of a positioned sample. In some disclosed embodiments, a particular mechanical processing may be applied to a surface of a gap area between the outer edge of the sample and the inner edge of the sample holder, which may increase the reflectivity and optical feature consistency of the gap area. In some disclosed embodiments, a first chemical coating may be applied to cover the surface of the gap area, which may reflect only a certain range of wavelengths of light, and a wavelength-dependent optical detector may receive the light reflected from the first chemical coating to generate an image for edge identification. In some disclosed embodiments, a second chemical coating may be applied to cover the first chemical coating, which may polarize the light reflected from the first coating, and the wavelength-dependent optical detector may receive the light polarized by the second chemical coating to generate the image for edge identification. By applying the disclosed embodiments, the outer edge of the sample and the inner edge of the sample holder may be identified with an increased successful rate, and thus the image inspection of the sample may be performed with higher accuracy.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A. B. or C, then, unless specifically stated otherwise or infeasible, the component may include A. or B, or C, or A and B, or A and C, or B and C, or A and B and C.

FIG. 1 illustrates an exemplary charged-particle beam inspection (CPBI) system 100 consistent with some embodiments of the present disclosure. CPBI system 100 may be used for imaging. For example, CPBI system 100 may use an electron beam for imaging. As shown in FIG. 1, CPBI system 100 includes a main chamber 101, a load/lock chamber 102, a beam tool 104, and an equipment front end module (EFEM) 106. Beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by beam tool 104. Beam tool 104 may be a single-beam system or a multi-beam system.

A controller 109 is electronically connected to beam tool 104. Controller 109 may be a computer configured to execute various controls of CPBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
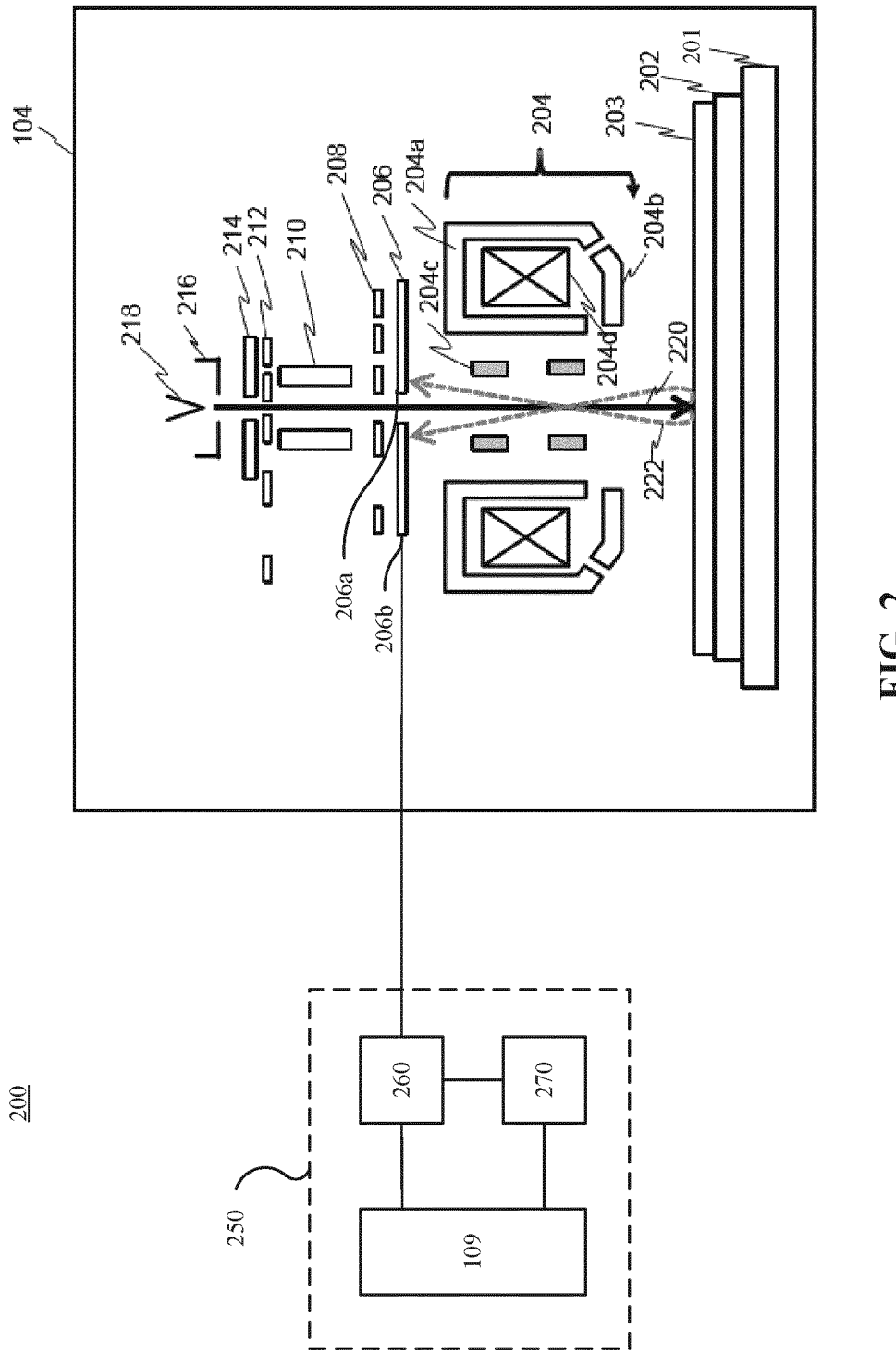
FIG. 2 is a schematic diagram illustrating an example charged-particle beam tool, consistent with some embodiments of the present disclosure that may be a part of the example charged-particle beam inspection system of FIG. 1.

FIG. 2 illustrates an example imaging system 200 according to embodiments of the present disclosure. Beam tool 104 of FIG. 2 may be configured for use in CPBI system 100. Beam tool 104 may be a single beam apparatus or a multi-beam apparatus. As shown in FIG. 2, beam tool 104 includes a motorized sample stage 201, and a wafer holder 202 supported by motorized sample stage 201 to hold a wafer 203 to be inspected. Beam tool 104 further includes an objective lens assembly 204, a charged-particle detector 206 (which includes charged-particle sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Beam tool 104 may additionally include an Energy Dispersive X-ray Spectrometer (EDS) detector (not shown) to characterize the materials on wafer 203.

A primary charged-particle beam 220 (or simply "primary beam 220"), such as an electron beam, is emitted from cathode 218 by applying an acceleration voltage between anode 216 and cathode 218. Primary beam 220 passes through gun aperture 214 and beam limit aperture 212, both of which may determine the size of charged-particle beam entering condenser lens 210, which resides below beam limit aperture 212. Condenser lens 210 focuses primary beam 220 before the beam enters objective aperture 208 to set the size of the charged-particle beam before entering objective lens assembly 204. Deflector 204c deflects primary beam 220 to facilitate beam scanning on the wafer. For example, in a scanning process, deflector 204c may be controlled to deflect primary beam 220 sequentially onto different locations of top surface of wafer 203 at different time points, to provide data for image reconstruction for different parts of wafer 203. Moreover, deflector 204c may also be controlled to deflect primary beam 220 onto different sides of wafer 203 at a particular location, at different time points, to provide data for stereo image reconstruction of the wafer structure at that location. Further, in some embodiments, anode 216 and cathode 218 may generate multiple primary beams 220, and beam tool 104 may include a plurality of deflectors 204c to project the multiple primary beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary beam 220 may be immersed in the magnetic field and may be electrically charged, which, in turn, creates an electric field. The electric field reduces the energy of impinging primary beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary charged-particle beam 222 (or "secondary beam 222"), such as secondary electron beams, may be emitted from the part of wafer 203 upon receiving primary beam 220. Secondary beam 222 may form a beam spot on sensor surfaces 206a and 206b of charged-particle detector 206. Charged-particle detector 206 may generate a signal (e.g., a voltage, a current, or the like) that represents an intensity of the beam spot and provide the signal to an image processing system 250. The intensity of secondary beam 222, and the resultant beam spot, may vary according to the external or internal structure of wafer 203. Moreover, as discussed above, primary beam 220 may be projected onto different locations of the top surface of the wafer or different sides of the wafer at a particular location, to generate secondary beams 222 (and the resultant beam spot) of different intensities. Therefore, by mapping the intensities of the beam spots with the locations of wafer 203, the processing system may reconstruct an image that reflects the internal or surface structures of wafer 203.

Imaging system 200 may be used for inspecting a wafer 203 on motorized sample stage 201 and includes beam tool 104, as discussed above. Imaging system 200 may also include an image processing system 250 that includes an image acquirer 260, storage 270, and controller 109. Image acquirer 260 may include one or more processors. For example, image acquirer 260 may include a computer, server, mainframe host, terminals, personal computer, any kind of mobile computing devices, and the like, or a combination thereof. Image acquirer 260 may connect with a detector 206 of beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may perform adjustments of brightness and contrast, or the like, of acquired images. Storage 270 may be a storage medium such as a hard disk, cloud storage, random access memory (RAM), other types of computer readable memory, and the like. Storage 270 may be coupled with image acquirer 260 and may be used for saving scanned raw image data as original images, post-processed images, or other images assisting of the processing. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image including a plurality of imaging areas. The single image may be stored in storage 270. The single image may be an original image that may be divided into a plurality of regions. Each of the regions may include one imaging area containing a feature of wafer 203.

Figure 3A:
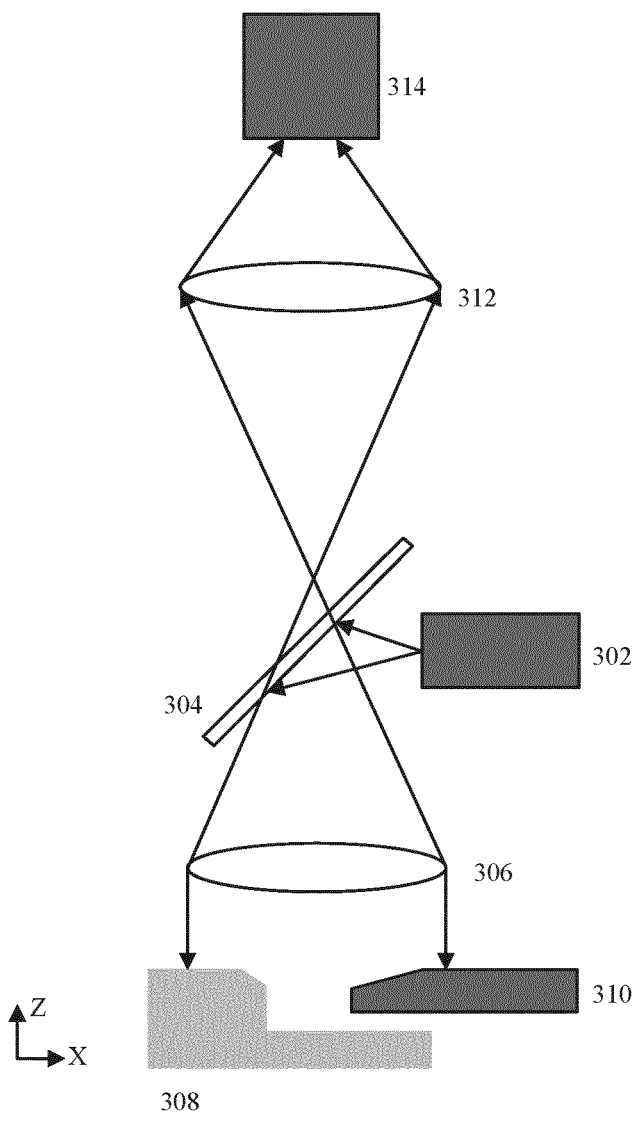
FIG. 3A is a schematic diagram illustrating an example system for imaging a sample on a sample holder, consistent with some embodiments of the present disclosure.

FIG. 3A is a schematic diagram illustrating an example system 300 for imaging a sample on a sample holder, consistent with some embodiments of the present disclosure. For example, system 300 may be a telecentric optical microscope that may be used to generate an optical image of the sample. It should be noted that system 300 may be any optical system capable of generating images of the sample, and are not limited to the example embodiments described herein.

System 300 may include an illumination unit and an image detection system. As illustrated in FIG. 3A, the illumination unit may include a light source 302, a beam splitter 304, and a first lens group 306. The illumination unit may direct light projected from light source 302 onto a sample holder 308 (e.g., an electrostatic holder) and a sample 310 (e.g., a wafer) positioned on sample holder 308. By way of example, light source 302 may be a single wavelength light source (e.g., green-light light-emitting diode (LED) that emits light at a wavelength of 525 nanometers (nm)), a broadband light source (e.g., a visible light LED that emits light at multiple wavelengths), or any type of light source, which are not limited to the examples described in this disclosure. As another example, optical properties of beam splitter 304 may include a 50% reflectivity, a 50% transmissivity, and an angle of incident ("AOI") at 45°. An angle of incident, as used herein, may refer to an included angle between a direction of a light beam projecting onto a point at the sample and a normal of a tangential surface crossing the point. It should be noted that the optical properties of beam splitter 304 may have various values depending on different application scenarios, which are not limited to the examples described in this disclosure.

As illustrated in FIG. 3A, the image detection system may include first lens group 306, beam splitter 304, a second lens group 312, and an optical detector 314 (e.g., a camera). By way of example, optical detector 314 may be a monochrome optical detector (e.g., a monochrome camera that records only grayscale values). The monochrome optical detector may generate a grayscale image, each pixel of which may only include a gray-level level (e.g., representing black, white, or gray color) that represent brightness of the pixel. The monochrome optical detector may record no color information of the sample.

Figure 3B:
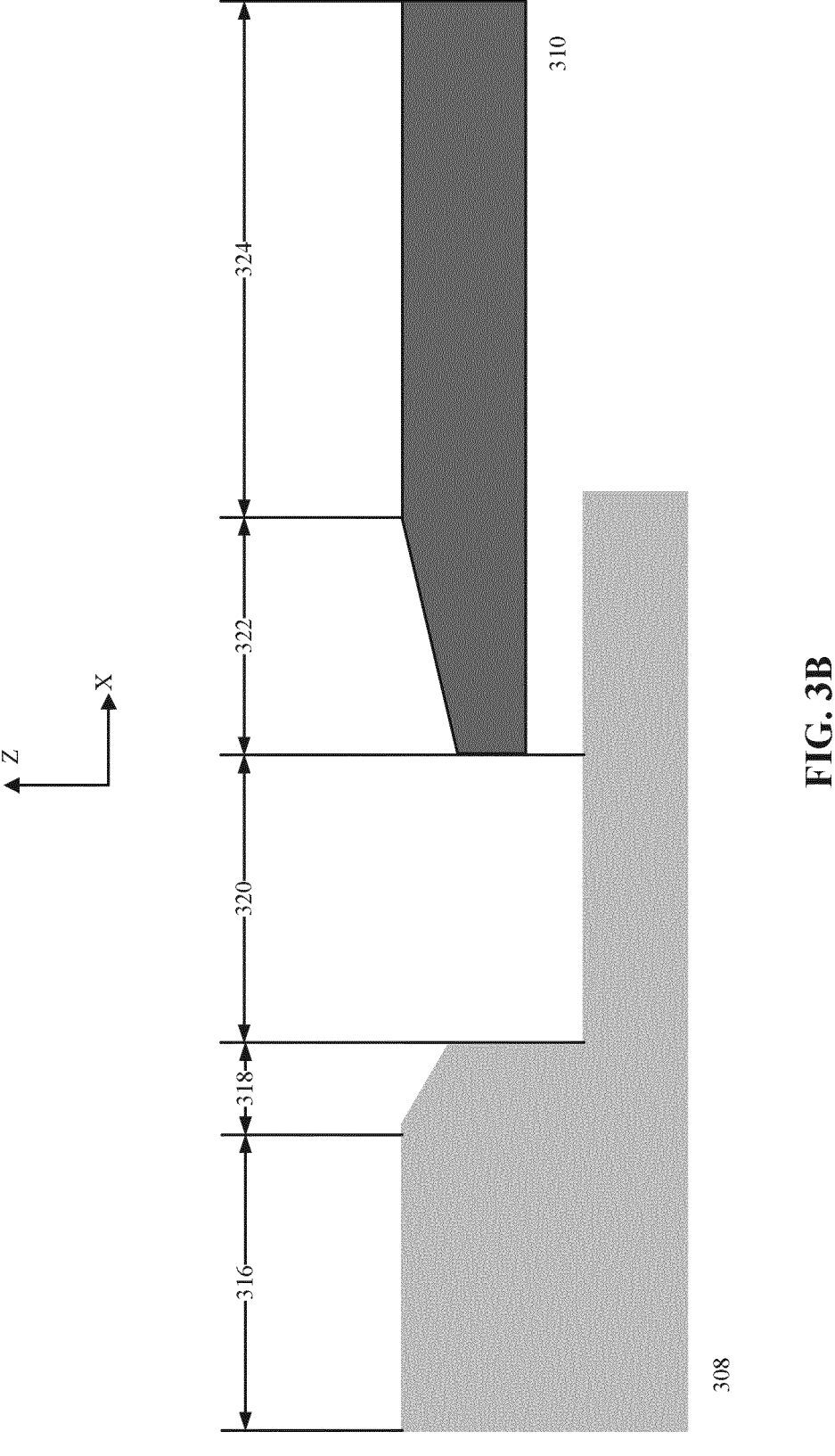
FIG. 3B is a schematic diagram illustrating a detailed view of a sample holder and a sample positioned on the sample holder in the system in FIG. 3A, consistent with some embodiments of the present disclosure.

FIG. 3B is a schematic diagram illustrating a detailed view of sample holder 308 and sample 310 in system 300 in FIG. 3A, consistent with some embodiments of the present disclosure. As illustrated in FIG. 3B, along an x-direction (shown in both FIGS. 3A-3B), sample holder 308 includes a holder surface 316 and a holder chamfer 318. Along the x-direction, sample 310 includes a sample chamfer 322 and a sample surface 324. A holder groove 320 is formed between holder chamfer 318 and sample chamfer 322, which is a gap area between an outer edge of sample 310 and an inner edge of sample holder 308.

Figure 4A:
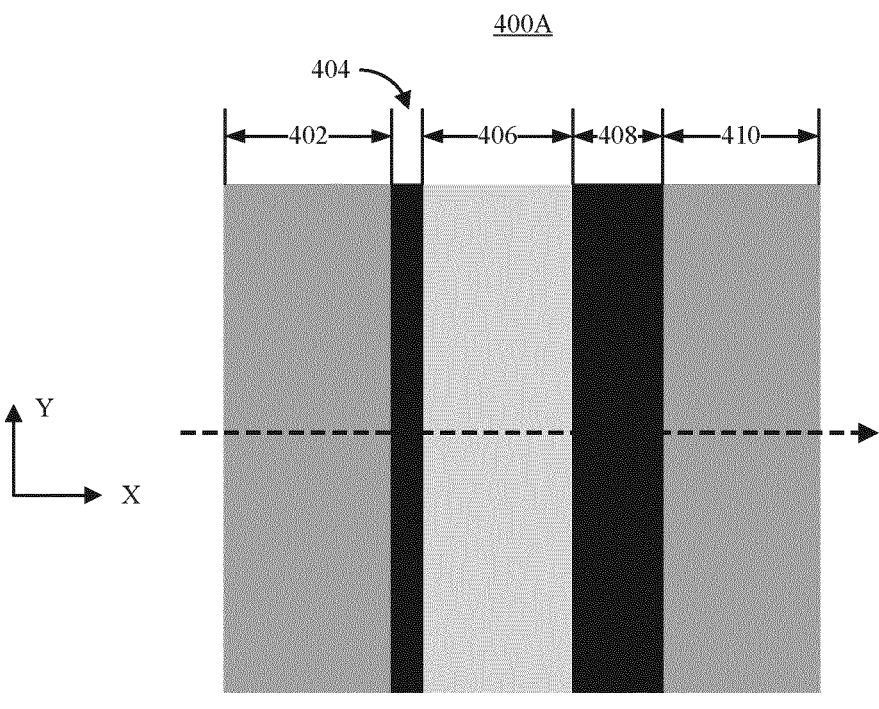
FIG. 4A illustrates an example image generated by the system in FIG. 3A, consistent with some embodiments of the present disclosure.

FIG. 4A illustrates an example image 400A generated by system 300 in FIG. 3A, consistent with some embodiments of the present disclosure. By way of example, image 400A may be generated by optical detector 314 that is a monochrome optical detector, and may only include gray-level values in its pixels. Along an x-direction (shown in both FIGS. 3A-4A and represented by a dash-line arrow in FIG. 4A), image 400A includes portions 402, 404, 406, 408, and 410 corresponding to holder surface 316, holder chamfer 318, holder groove 320, sample chamfer 322, and sample surface 324 in FIG. 3B, respectively. As illustrated in FIG. 4A, portions 402, 404, 406, 408, and 410 have different grayscale values (or gray-level intensities). The grayscale values of pixels in portions 402, 404, 406, 408, and 410 may depend on reflectivity values and angles of incident of holder surface 316, holder chamfer 318, holder groove 320, sample chamfer 322, and sample surface 324, respectively. For example, holder surface 316, holder groove 320, and sample surface 324 have positive reflectivity values and a substantially zero angle of incident, and thus portions 402, 406, and 410 of image 400A may be brighter (e.g., having higher gray-level intensities). Holder chamfer 318 and sample chamfer 322 may have positive reflectivity values and angles of incident greater than zero, and thus portions 404 and 408 of image 400A may be darker (e.g., having lower gray-level intensities).

Figure 4B:
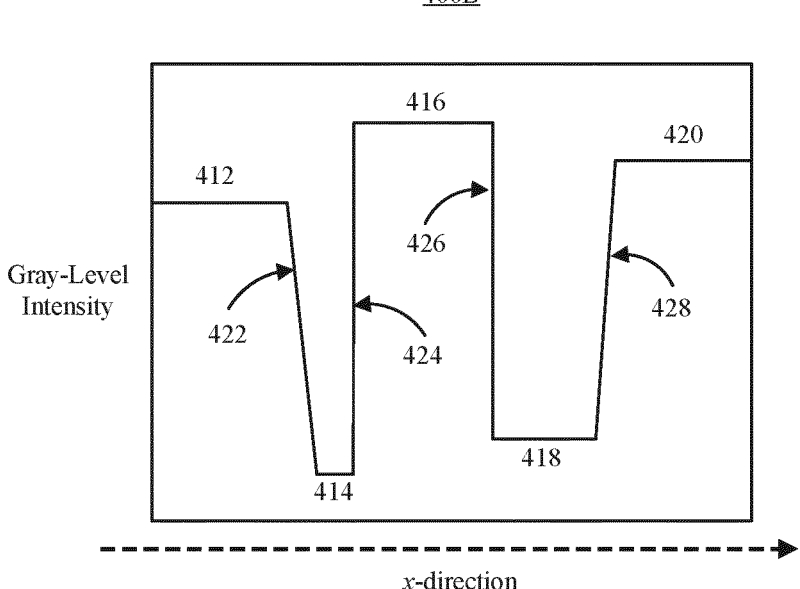
FIG. 4B illustrates an example gray-level profile of the image of FIG. 4A, consistent with some embodiments of the present disclosure.

FIG. 4B illustrates an example gray-level profile 400B of image 400A in FIG. 4A, consistent with some embodiments of the present disclosure. The x-axis (represented by a dash-line arrow in FIG. 4B) of gray-level profile 400B represents the x-direction in FIG. 4A. The y-axis of gray-level profile 400B represents gray-level intensity values. As illustrated in FIG. 4B, a polygonal line representing gray-level intensity values in gray-level profile 400B includes segments 412, 414, 416, 418, and 420 corresponding to gray-level intensity values of portions 402, 404, 406, 408, and 410 in FIG. 4A, respectively. As described, because portions 402, 406, and 410 are brighter than portions 404 and 408 in image 400A, segments 412, 416, and 420 are higher than segments 414 and 418 in gray-level profile 400B. Gray-level profile 400B further includes segments 422, 424, 426, and 428, which represent gray-level intensity values of four intermediate or transition regions between portions 402 and 404, between portions 404 and 406, between portions 406 and 408, and between portions 408 and 410, respectively. It should be noted that the outer edge of the sample is at a location corresponding to segment 426, and the inner edge of the sample holder is at a location corresponding to segment 424.

With reference to FIGS. 3A-4B, it should be noted that the reflectivity values of holder surface 316, holder chamfer 318, and holder groove 320 may be determined by the manufacturer of the sample holder, but the reflectivity values of sample chamfer 322 and sample surface 324 may be determined by the provider of the sample. For example, holder surface 316 may be processed to have a non-reflective finish (e.g., a matte finish).

In some embodiments, based on image 400A and gray-level profile 400B, a location of sample 310 may be determined. For example, in a method of determining an absolute location of sample 310, three or more coordinates on the outer edge of the sample (e.g., being at locations corresponding to segment 426 in FIG. 4B) and three or more gap distances (e.g., widths of portion 406 in FIG. 4A) between the outer edge of the sample and the inner edge of the sample holder (e.g., being at locations corresponding to segment 424 in FIG. 4B) may be obtained. Based on those coordinates of the outer edge of the sample and the gap distances, the absolute location of sample 310 on sample holder 308 may be determined by an image processing algorithm. Such an image processing algorithm may rely on changes of gray level changes in the image for edge identification.

However, the gray level changes of segments 420 and 428 in gray-level profile 400B are unpredictable because they depend on the provider of the sample. Also, holder surface 316 and holder groove 320 may have inconsistent reflectivity values due to optical variations. Further, holder chamfer 318 may have mechanical errors. Because of the above-described challenges, the inconsistent gray-level profiles and low contrast between portion 406 and portions 402 and 410 in image 400A may cause difficulty for the image processing algorithm to identify the outer edge of the sample (e.g., being at locations corresponding to segment 426 in FIG. 4B) and the inner edge of the sample holder (e.g., being at locations corresponding to segment 424 in FIG. 4B).

Consistent with some embodiments of this disclosure, an apparatus for detecting a location of a positioned sample may include an electrostatic holder that may hold a sample (e.g., a wafer) and form a gap area between an outside edge of the sample and a structure of the electrostatic holder when the electrostatic holder holds the sample. The gap area may be coated with a first coating that may reflect a first wavelength of light with first brightness and to reflect a second wavelength of the light with second brightness. The first wavelength may be within a predetermined range of wavelengths, and the second wavelength may be outside the predetermined range of wavelengths. The first brightness may be higher than the second brightness.

An electrostatic holder, as used herein, may refer to a device for placing and securing the sample on a sample holder. The sample holder described herein may be an electrostatic holder. The electrostatic holder may be installed on a sample stage (e.g., sample stage 201 as illustrated and described in association with FIG. 2). The electrostatic holder may include at least one electrode, and a non-conductive dielectric material may be provided between the electrode and the sample. For example, the electrode may be provided underneath the top surface of the sample holder. When being applied with a clamping voltage, the electrode may attract and secure the sample to the top surface of the sample holder via an electrostatic field. When the clamping voltage is off, the electrode may lose the electrostatic field, and the sample may be released from the sample holder. The electrostatic holder may also be referred to as an electrostatic chuck ("e-chuck"). By way of example, with reference to FIGS. 3A-4B, the sample holder may be sample holder 308, and the sample may be sample 310. The gap area may be holder groove 320 as shown and described in association with FIGS. 3A-4B.

A coating, as used herein, may refer to a layer (e.g., a chemically deposited layer), a waveplate (e.g., a polymer waveplate), a film (e.g., a retarder film), or any surface structure applied on a surface of an object. The first coating may be a wavelength-dependent light-absorption coating. In some embodiments, the first wavelength of the light may include one of a red light, a blue light, or a green light. The second wavelength of the light may include another one of the red light, the blue light, or the green light. For example, the first wavelength of the light is a blue light, and the second wavelength of the light is a green light or a red light. The first coating may reflect the blue light with a higher brightness and reflect the red light or the green light with a lower brightness. In some embodiments, the first coating may reflect the first wavelength of the light (e.g., the blue light) with a higher brightness and reflect all light in the second wavelength (e.g., all non-blue light, such as the red light or the green light) with a lower brightness.

Figure 5:
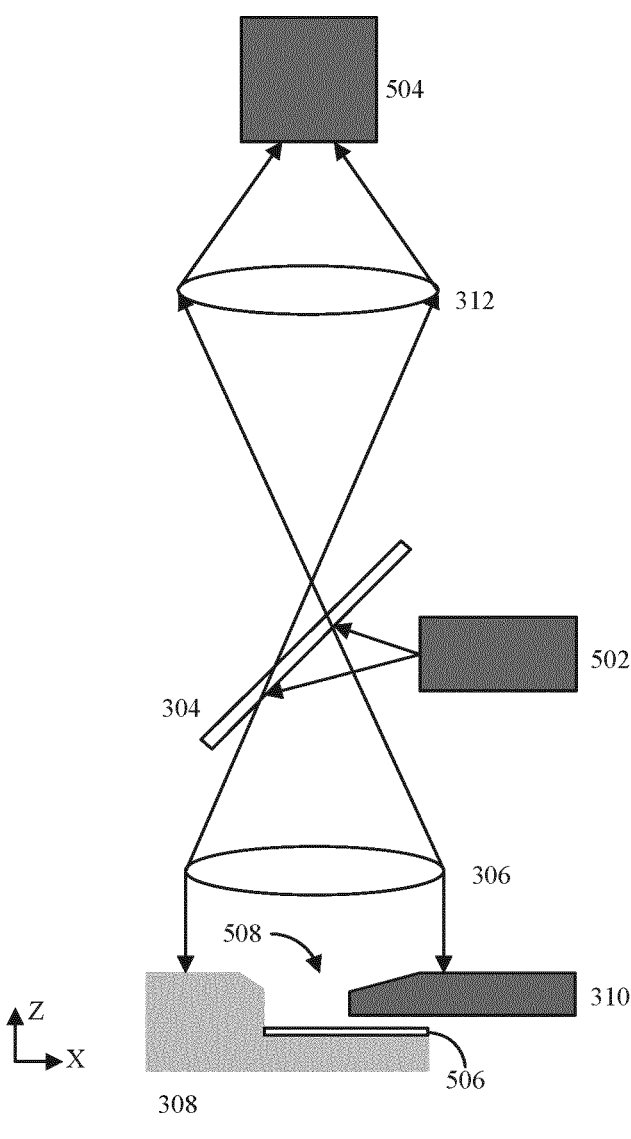
FIG. 5 is a schematic diagram illustrating another example system for imaging a sample on a sample holder, consistent with some embodiments of the present disclosure.

By way of example, FIG. 5 is a schematic diagram illustrating an example system 500 for imaging sample 310 on sample holder 308, consistent with some embodiments of the present disclosure. As illustrated in FIG. 5, a first coating 506 may cover a gap area 508 that is formed between the outer edge of sample 310 and the inner edge of sample holder 308.

Consistent with some embodiments of this disclosure, the apparatus for detecting the location of the positioned sample may also include a light source that may direct the light at the gap area. In some embodiments, the light source may include a broadband light source. The light emitted by the light source may include a plurality of wavelengths. For example, the light may be a visible light (e.g., a white light).

By way of example, with reference to FIG. 5, system 500 may include an illumination unit. The illumination unit may include a light source 502, beam splitter 304, and first lens group 306. As an example, light source 502 may be a white light-emitting diode (LED).

Consistent with some embodiments of this disclosure, the apparatus for detecting the location of the positioned sample may further include an optical detector that may image the light reflected off the gap area. The optical detector may detect or sense light and generate a corresponding signal (e.g., an electronic signal) for generating an image. In some embodiments, the optical detector may image the light in a plurality of color channels. For example, the optical detector may include a camera (e.g., a multicolor camera). In some embodiments, the plurality of color channels may include a red channel, a green channel, and a blue channel.

By way of example, with reference to FIG. 5, system 500 may include an image detection system. The image detection system may include first lens group 306, beam splitter 304, second lens group 312, and an optical detector 504. Optical detector 504 may be a wavelength-dependent light detector, such as a multicolor camera (e.g., a camera that may capture colors or red, green, and blue).

In some embodiments, the first coating may reflect a third wavelength of the light with third brightness. The third wavelength of the light may be outside the predetermined range of wavelengths, and the first brightness is higher than the third brightness. For example, the first wavelength of light may be a blue light, the second wavelength of light may be a green light, and the third wavelength of light may a red light. The first coating may reflect the blue light with a higher brightness and both the green light and the red light with a lower brightness.

In some embodiments, when the first coating may reflect the third wavelength, the optical detector may further image the light reflected off the gap area as a first image in a first color channel (e.g., a blue channel), a second image in a second color channel (e.g., a green channel), and a third image in a third color channel (e.g., a red channel). The first wavelength of the light may be imaged in the first color channel, the second wavelength of the light may be imaged in the second color channel, and the third wavelength of the light may be imaged in the third color channel. The apparatus may further include circuitry (e.g., the optical detector itself, or a controller or image processing system communicatively coupled to the optical detector) that may generate a synthesis image based on the first image, the second image, and the third image. In some embodiments, the first image, the second image, and the third image may be generated from a single image exposure.

In some embodiments, to generate the synthesis image, the apparatus may further include circuitry (e.g., the optical detector itself, or a controller or image processing system communicatively coupled to the optical detector) that may determine a gray level of a pixel based on a first difference and a second difference, in which the first difference may be between a first gray level of a first pixel of the first image and a second gray level of a second pixel of the second image, and the second difference may be between the first gray level of the first pixel of the first image and a third gray level of a third pixel of the third image. The first pixel, the second pixel, and the third pixel may be co-located. Then, the optical detector may generate the synthesis image based on the gray level of the pixel.

Being co-located, as described herein, may refer to two or more objects having the same relative position in a coordinate system with the same definition of origin. For example, the first pixel may be positioned at a first coordinate $(x_1, y_1)$ with respect to a first origin $(0, 0)$ in the first image (e.g., the first origin being a top-left corner, a top-right corner, a bottom-left corner, a bottom-right corner, a center, or any position of the first image). The second pixel may be positioned at a second coordinate $(x_2, y_2)$ with respect to a second origin $(0, 0)$ in the second image, in which the second origin shares the same definition as the first origin. For example, the second origin may be a top-left corner of the second image if the first origin is a top-left corner of the first image, a top-right corner of the second image if the first origin is a top-right corner of the first image, a bottom-left corner of the second image if the first origin is a bottom-left corner of the first image, a bottom-right corner of the second image if the first origin is a bottom-right corner of the first image, or a center of the second image if the first origin is a center of the first image. In such cases, if $x_1$ and $x_2$ have the same value, and $y_1$ and $y_2$ have the same value, the first pixel in the first image and the second pixel in the second image may be referred to as "co-located."

In some embodiments, to generate the synthesis image based on the gray level of the pixel, the apparatus may further include circuitry (e.g., the optical detector itself, or a controller or image processing system communicatively coupled to the optical detector) that may determine the gray level of the pixel as a weighted sum of the first difference and the second difference. The first difference may be weighted with a first weight value, and the second difference may be weighted with a second weight value. The first weight value and the second weight value may be in a range between zero and one.

By way of example, the optical detector may determine the gray level of the pixel in accordance with Eq. (1):

$$GLV_P = a*(GLV_{P1} - GLV_{P2}) + b*(GLV_{P1} - GLV_{P3}) \qquad \text{Eq. (1)}$$

In Eq. (1), $GLV_P$ represents the gray level of the pixel. $GLV_{P1}$, $GLV_{P2}$, and $GLV_{P3}$ represent the first gray level of the first pixel of the first image, the second gray level of the second pixel of the second image, and the third gray level of the third pixel of the third image, respectively. Parameters a and b represent the first weight value and the second weight value, respectively, which are both in a range between zero and one. By using a and b, the maximum value of $GLV_P$ may be ensured to not exceed a predetermined maximum gray-scale value (e.g., 255).

Figures 6A, 6B:
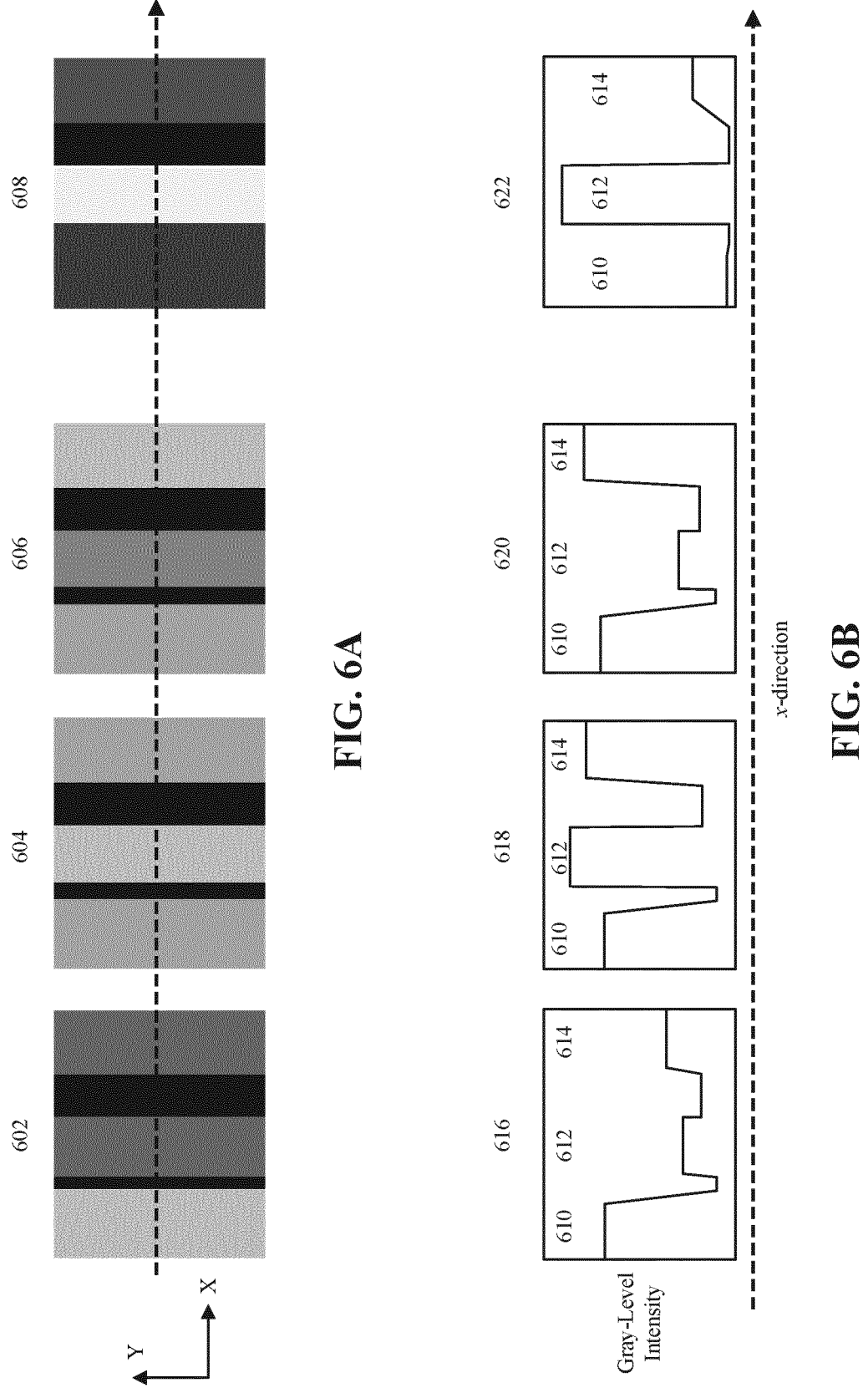
FIG. 6A illustrates example images generated by the system in FIG. 5, consistent with some embodiments of the present disclosure.
FIG. 6B illustrates example gray-level profiles of the images of FIG. 6A, consistent with some embodiments of the present disclosure.

FIG. 6A illustrates example images 602, 604, 606, and 608 generated by system 500 in FIG. 5, consistent with some embodiments of the present disclosure. Images 602, 604, and 606 may represent the first image generated by optical detector 504 in the first color channel (e.g., a red channel), the second image generated by optical detector 504 in the second color channel (e.g., a blue channel), and the third image generated by optical detector 504 in the third color channel (e.g., a green channel), respectively. Image 608 may be the synthesis image generated based on images 602, 604, and 606. For each pixel of image 608, the gray level of the pixel may be determined using a first gray level of its first co-located pixel in image 604, a second gray level of its second co-located pixel in image 602, and a third gray level of its third co-located pixel in image 606 in accordance with Eq. (1). Along an x-direction (represented by a dash-line arrow in FIG. 6A), each of images 602, 604, 606, and 608 includes five portions that have different gray-level intensities (e.g., representing brightness) corresponding to holder surface 316, holder chamfer 318, holder groove 320, sample chamfer 322, and sample surface 324 in FIG. 3B, respectively.

FIG. 6B illustrates example gray-level profiles 616, 618, 620, and 622 corresponding to images 602, 604, 606, and 608 in FIG. 6A, respectively, consistent with some embodiments of the present disclosure. The x-axis (represented by a dash-line arrow in FIG. 6B) of gray-level profiles 616, 618, 620, and 622 represents the x-direction in FIG. 6A. The y-axis of gray-level profiles 616, 618, 620, and 622 represents gray-level intensity values. As illustrated in FIG. 6B, in each of gray-level profiles 616, 618, 620, and 622, a polygonal line representing gray-level intensity values includes segments 610, 612, and 614. With reference to FIG. 3B, segments 610 in gray-level profiles 616, 618, 620, and 622 may represent gray-level intensity values of portions that correspond to holder surface 316 in images 602, 604, 606, and 608, respectively. Segments 612 in gray-level profiles 616, 618, 620, and 622 may represent gray-level intensity values of portions that correspond to holder groove 320 in images 602, 604, 606, and 608, respectively. Segments 614 in gray-level profiles 616, 618, 620, and 622 may represent gray-level intensity values of portions that correspond to sample surface 324 in images 602, 604, 606, and 608, respectively.

Typically, the reflectivity value of holder surface 316 is not wavelength dependent, by which holder surface 316 may reflect all wavelengths of the incident light with substantially equal reflectivity. The reflectivity value of sample surface 324 may or may not be wavelength dependent, depending on their surface materials or surface treatments. When the reflectivity value of sample surface 324 is wavelength dependent, the wavelength dependency of sample surface 324 may be the same as or different from the wavelength dependency of holder groove 320. With reference to FIGS. 5-6B, after being applied with first coating 506, the reflectivity value of the surface of gap area 508 at the bottom of holder groove 320 may become wavelength dependent.

By way of example, assuming images 602, 604, and 606 in FIG. 6A are in red, blue, and green channels, respectively, as illustrated in FIG. 6B, the reflectivity value (represented by segments 610) of holder surface 316 may be wavelength independent, in which holder surface 316 may reflect red, blue, and green lights with substantially the same reflectivity. Because of first coating 506, the reflectivity values (represented by segments 612) of the surface of gap area 508 are wavelength dependent, in which the surface of gap area 508 may reflect blue light with a higher reflectivity (e.g., higher than 80% or any other threshold percentage) and reflect red light and green light with a lower reflectivity (e.g., lower than 20% or any other threshold percentage). Also illustrated in FIG. 6B, the reflectivity value (represented by segments 614) of sample surface 324 is wavelength dependent, in which sample surface 324 may reflect blue light and green light with higher reflectivity and reflect red light with a lower reflectivity. Based on images 602, 604, and 606 and in accordance with Eq. (1), image 608 may be generated. As illustrated in gray-level profile 622 in FIG. 6B, the gray-level intensity difference between segment 610 and segment 612 as well as the gray-level intensity difference between segment 614 and segment 612 both become larger compared with gray-level profile 616-620. Correspondingly, as illustrated in image 608 in FIG. 6A, the image contrast between the portions corresponding to holder groove 320 and holder surface 316 as well as the image contrast between the portions corresponding to holder groove 320 and sample surface 324 become sharper. As a result, compared with existing technical solutions, using image 608, an image processing algorithm may have higher success rate of edge identification to determine the outer edge of the sample (e.g., sample 310) and the inner edge of the sample holder (e.g., sample holder 308).

Consistent with some embodiments of this disclosure, the apparatus for detecting the location of the positioned sample may further include a polarizing beam splitter for polarize the light directed at the gap area with a predetermined polarity (e.g., an s-polarity or a p-polarity). In some embodiments, the first coating on the gap area may be coated with a second coating for modifying polarization of the light.

Figure 7:
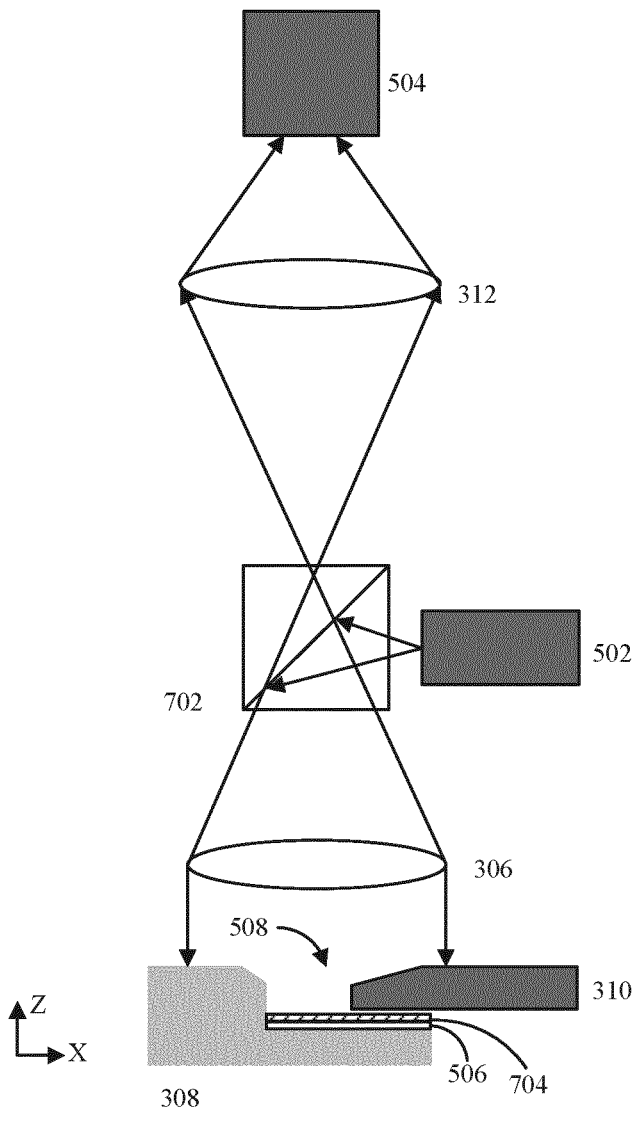
FIG. 7 is a schematic diagram illustrating yet another example system for imaging a sample on a sample holder, consistent with some embodiments of the present disclosure.

By way of example, FIG. 7 is a schematic diagram illustrating an example system 700 for imaging sample 310 on sample holder 308, consistent with some embodiments of the present disclosure. Compared with system 600 in FIG. 6, system 700 replaces beam splitter 304 with a polarizing beam splitter 702, and a second coating 704 is applied on top of first coating 506. For example, polarizing beam splitter 702 may only reflect a particular polarity component of an incident light and transmit other polarity components of the incident light. In some embodiments, polarizing beam splitter 702 may include a ¾ polarizing filter or any other polarizing filter. Polarizing beam splitter 702 may polarize one or more wavelengths of the light emitted from light source 502, such as at least one of red, blue, or green lights.

By way of example, with reference to FIG. 7, when light source 502 emit light onto polarizing beam splitter 702, polarizing beam splitter 702 may polarize the light by reflecting the light with only a first polarity (e.g., an s-polarity or a p-polarity) onto sample holder 308, gap area 508, and sample 310, and allowing the light with other polarities to penetrate or transmit without being reflected. In gap area 508, the light may penetrate second coating 704 to reach first coating 506 and be reflected. The reflected light may penetrate second coating 704 again, after which the second coating 704 may change it from the first polarity to second polarity (e.g., the p-polarity or the s-polarity). Outside gap area 508 (e.g., holder surface 316, holder chamfer 318, sample chamfer 322, and sample surface 324 as described in association with FIG. 3B), the light may be reflected without changing its polarity (e.g., maintaining its first polarity). All light reflected from sample holder 308, gap area 508, and sample 310 may reach polarizing beam splitter 702. Because polarizing beam splitter 702 reflects light with the first polarity, the light reflected from surfaces outside gap area 508 (i.e., with the first polarity) may be reflected again by polarizing beam splitter 702 and may not reach optical detector 504, while the light reflected in gap area 508 (i.e., with the second polarity) may penetrate polarizing beam splitter 702 to reach optical detector 504. As a result, optical detector 504 may generate images in which gap area 508 is much brighter than areas outside gap area 508.

Figures 8A, 8B:
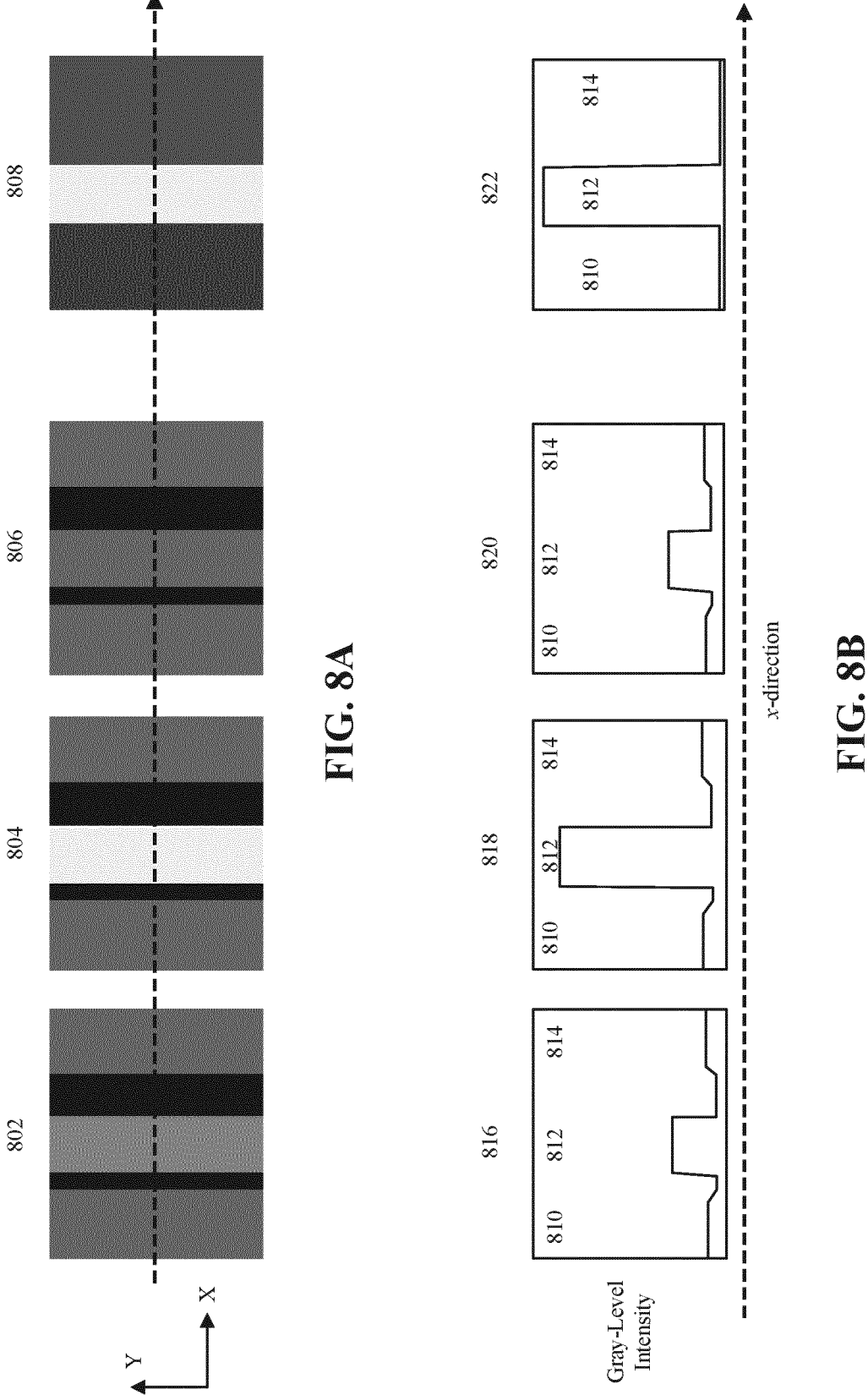
FIG. 8A illustrates example images generated by the system in FIG. 7, consistent with some embodiments of the present disclosure.
FIG. 8B illustrates example gray-level profiles of the images of FIG. 8A, consistent with some embodiments of the present disclosure.

FIG. 8A illustrates example images 802, 804, 806, and 808 generated by system 700 in FIG. 7, consistent with some embodiments of the present disclosure. Images 802, 804, and 806 may represent the first image generated by optical detector 504 in the first color channel (e.g., a red channel), the second image generated by optical detector 504 in the second color channel (e.g., a blue channel), and the third image generated by optical detector 504 in the third color channel (e.g., a green channel), respectively. Image 808 may be the synthesis image generated based on images 802, 804, and 806. For each pixel of image 808, the gray level of the pixel may be determined using a first gray level of its first co-located pixel in image 804, a second gray level of its second co-located pixel in image 802, and a third gray level of its third co-located pixel in image 806 in accordance with Eq. (1). Along an x-direction (represented by a dash-line arrow in FIG. 8A), each of images 802, 804, 806, and 808 includes five portions that have different gray-level intensities (e.g., representing brightness) corresponding to holder surface 316, holder chamfer 318, holder groove 320, sample chamfer 322, and sample surface 324 in FIG. 3B, respectively.

FIG. 8B illustrates example gray-level profiles 816, 818, 820, and 822 corresponding to images 802, 804, 806, and 808 in FIG. 8A, consistent with some embodiments of the present disclosure. The x-axis (represented by a dash-line arrow in FIG. 8B) of gray-level profiles 816, 818, 820, and 822 represents the x-direction in FIG. 8A. The y-axis of gray-level profiles 816, 818, 820, and 822 represents gray-level intensity values. As illustrated in FIG. 8B, in each of gray-level profiles 816, 818, 820, and 822, a polygonal line representing gray-level intensity values includes segments 810, 812, and 814. With reference to FIG. 3B, segments 810 in gray-level profiles 816, 818, 820, and 822 may represent gray-level intensity values of portions that correspond to holder surface 316 in images 802, 804, 806, and 808, respectively. Segments 812 in gray-level profiles 816, 818, 820, and 822 may represent gray-level intensity values of portions that correspond to holder groove 320 in images 802, 804, 806, and 808, respectively. Segments 814 in gray-level profiles 816, 818, 820, and 822 may represent gray-level intensity values of portions that correspond to sample surface 324 in images 802, 804, 806, and 808, respectively.

Compared with segments 610-614 in gray-level profiles 616-620 of FIG. 6B, the gray-level intensity values of segments 810 and 814 are significantly reduced in gray-level profiles 816-820 in FIG. 8B, while the gray-level intensity values of segments 812 are substantially the same in gray-level profiles 816-820. As a result, compared with gray-level profile 622 of FIG. 6B, the gray-level intensity difference between segment 810 and segment 812 in gray-level profile 822 of FIG. 8B become even larger than the gray-level intensity difference between segment 610 and segment 612, and the gray-level intensity difference between segment 814 and segment 812 in gray-level profile 822 become even larger than the gray-level intensity difference between segment 614 and segment 612. Correspondingly, the image contrast between the portions corresponding to holder groove 320 and holder surface 316 in image 808 of FIG. 8A become even sharper than the image contrast between the portions corresponding to holder groove 320 and holder surface 316 in image 608 of FIG. 6A, and the image contrast between the portions corresponding to holder groove 320 and sample surface 324 in image 808 of FIG. 8A become even sharper than the image contrast between the portions corresponding to holder groove 320 and sample surface 324 in image 608 of FIG. 6A. As a result, compared with image 608, using image 808, an image processing algorithm may have even higher success rate of edge identification to determine the outer edge of the sample (e.g., sample 310) and the inner edge of the sample holder (e.g., sample holder 308).

Consistent with some embodiments of this disclosure, an apparatus for detecting a location of a positioned sample may include an electrostatic holder that may hold a sample and form a gap area between an outside edge of the sample and a structure of the electrostatic holder when the electrostatic holder holds the sample. A surface of the gap area may be applied with a mechanical milling process. The apparatus may also include a light source that may direct the light at the gap area. The apparatus may further include an optical detector that may image the light reflected off the gap area.

In some embodiments, the surface of the gap area may be an aluminum surface. In some embodiments, finish conditions of the mechanical milling process may include at least one of a rotating milling speed greater than or equal to 4000 rounds per minute (RPM), a linear feed lower than or equal to two millimeter per second, or a z-axis cutting feed lower than or equal to 0.03 millimeter.

Figure 9:
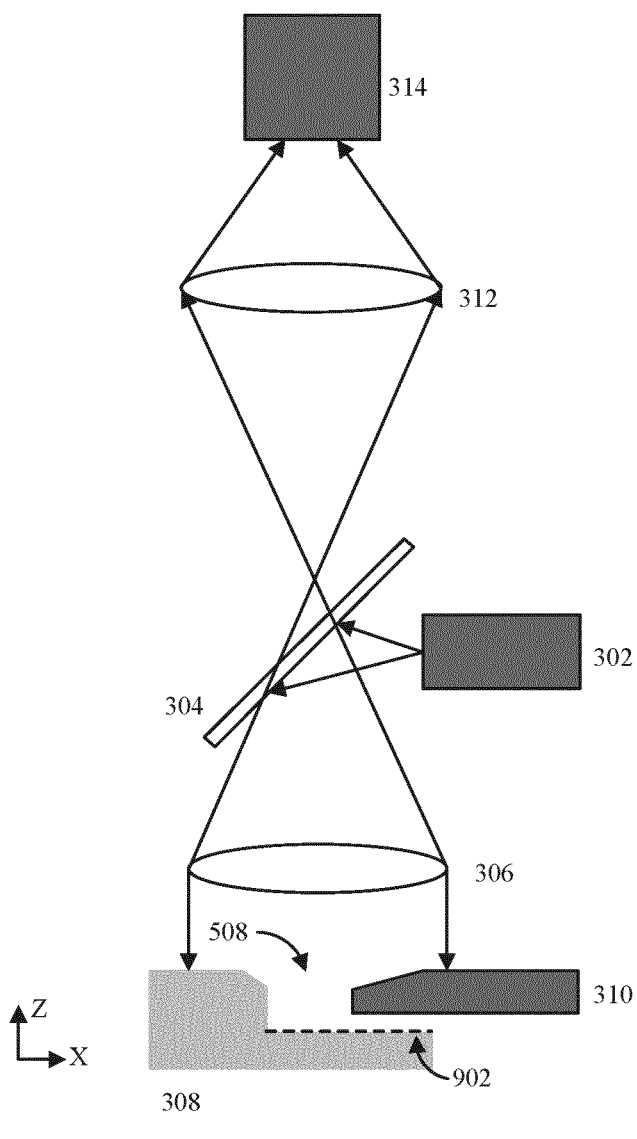
FIG. 9 is a schematic diagram illustrating yet another example system for imaging a sample on a sample holder, consistent with some embodiments of the present disclosure.

By way of example, FIG. 9 is a schematic diagram illustrating an example system 900 for imaging sample 310 on sample holder 308, consistent with some embodiments of the present disclosure. Compared with system 300 described in association with FIGS. 3A-3B, in system 900, a surface 902 of gap area 508 may be applied with a mechanical milling process to increase its reflectivity and to increase consistency of optical features between surface 902, holder surface 316, and the surface of holder chamfer 318. As an example, if surface 902 is an aluminum surface, the finish conditions of the mechanical milling process may include at least one of a rotating milling speed greater than or equal to 5000 RPM, a linear feed lower than or equal to one millimeter per second, or a z-axis cutting feed lower than or equal to 0.0025 millimeter. After applying the mechanical milling process, surface 902 may have mill tooling marks. In some embodiments, such mill tooling marks may be kept without being removed or further processed.

Figure 10A:
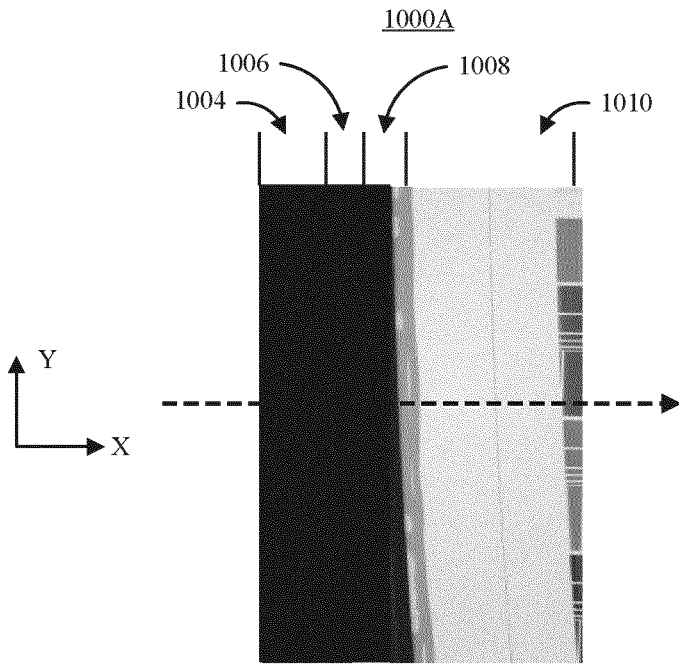
FIG. 10A illustrates an example image of a sample generated by a system other than the system in FIG. 9, consistent with some embodiments of the present disclosure.
Figure 10B:
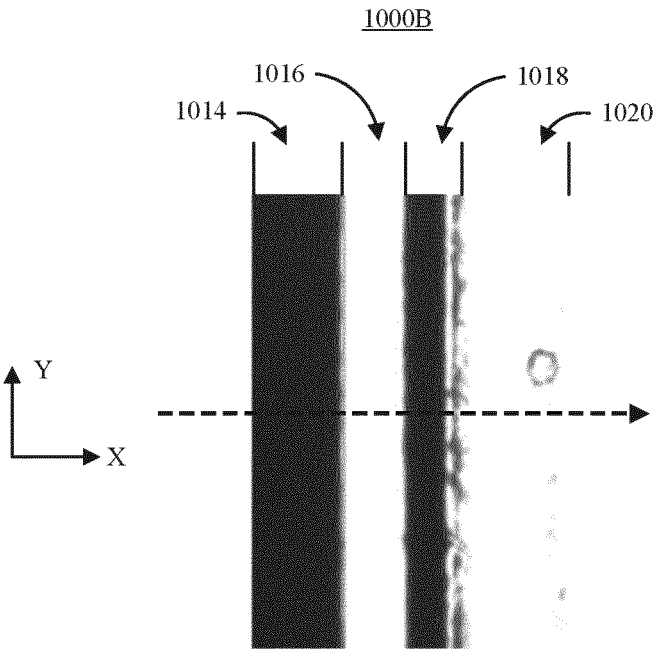
FIG. 10B illustrates an example image generated by the system in FIG. 9, consistent with some embodiments of the present disclosure.

FIG. 10A illustrates an example image 1000A of a sample (e.g., sample 310) generated by a system (e.g., system 300 in FIG. 3A) other than system 900 in FIG. 9, consistent with some embodiments of the present disclosure. FIG. 10B illustrates an example image 1000B generated by system 900 in FIG. 9, consistent with some embodiments of the present disclosure. Image 1000B may be generated after surface 902 is applied with the mechanical milling process described in association with FIG. 9. As an example, images 1000A and 1000B may be generated by optical detector 314 that is a monochrome optical detector, and may only include gray-level values in their pixels.

With reference to FIG. 3B, along an x-direction (represented by dash-line arrows in FIGS. 10A-10B), image 1000A includes portions 1004, 1006, 1008, and 1010 corresponding to holder chamfer 318, holder groove 320, sample chamfer 322, and sample surface 324, respectively. Along the x-direction, image 1000B includes portions 1014, 1016, 1018, and 1010 corresponding to holder chamfer 318, holder groove 320, sample chamfer 322, and sample surface 324, respectively. As illustrated in FIGS. 10A-10B, compared with portions 1004, 1006, 1008, and 1010, portions 1014, 1016, 1018, and 1010 have sharper image contrast and more consistent optical features within each of them. For example, portion 1006 is almost indistinguishable from portion 1004 and a neighboring region of portion 1008, while portion 1016 is clearly distinguishable from portions 1014 and 1018. As another example, portion 1020 is brighter than portion 1010. As a result, compared with image 1000A, using image 1000B, an image processing algorithm may have higher success rate of edge identification to determine the outer edge of the sample (e.g., sample 310) and the inner edge of the sample holder (e.g., sample holder 308).

FIG. 11 is a flowchart illustrating an example method 1100 for detecting a location of a positioned sample, consistent with some embodiments of the present disclosure. Method 1100 includes steps 1102-1108.

At step 1102, a light reflected off a gap area (e.g., gap area 508 described in association with FIGS. 5-8) formed between an outside edge of a sample (e.g., sample 310 described in association with FIGS. 3A-8) held at an electrostatic holder (e.g., sample holder 308 described in association with FIGS. 3A-8) and a structure (e.g., an inner edge) of the electrostatic holder may be obtained (e.g., by optical detector 504 described in association with FIGS. 5-8). The gap area may be coated with a first coating (e.g., first coating 506 described in association with FIGS. 3A-8B) that may reflect a first wavelength of light with first brightness, to reflect a second wavelength of the light with second brightness, and to reflect a third wavelength of the light with third brightness. The first wavelength may be within a predetermined range of wavelengths, and the second wavelength and the third wavelength may be outside the predetermined range of wavelengths. The first brightness may be higher than the second brightness and the third brightness. In some embodiments, the first coating may be coated with a second coating (e.g., second coating 704 described in association with FIGS. 7-8B) that may modify polarization of the light.

In some embodiments, the light may include a plurality of wavelengths. For example, the light may include a visible light (e.g., a white light). In some embodiments, the first wavelength of the light, the second wavelength of the light, and the third wavelength of the light may include a red light, a blue light, and a green light.

At step 1104, the light may be imaged (e.g., by optical detector 504 described in association with FIGS. 5-8B and image processing system 250 described in association with FIG. 2) as a first image (e.g., image 604 described in association with FIG. 6A) in a first color channel (e.g., a blue channel), a second image (e.g., image 602 described in association with FIG. 6A) in a second color channel (e.g., a red channel), and a third image (e.g., image 606 described in association with FIG. 6A) in a third color channel (e.g., a green channel). A first wavelength of the light (e.g., a blue light) may be imaged in the first color channel. A second wavelength (e.g., a red light) of the light may be imaged in the second color channel. A third wavelength of the light (e.g., a green light) may be imaged in the third color channel.

At step 1106, a synthesis image (e.g., image 608 described in association with FIG. 6A) may be generated (e.g., by image processing system 250 described in association with FIG. 2) based on the first image, the second image, and the third image. At step 1108, a location of the sample may be determined (e.g., by image processing system 250 described in association with FIG. 2) based on the synthesis image.

In some embodiments, to generate the synthesis image, a gray level of a pixel may be determined (e.g., by image processing system 250 described in association with FIG. 2) based on a first difference and a second difference. The first difference may be between a first gray level (e.g., $GLV_{P1}$ described in association with Eq. (1)) of a first pixel of the first image and a second gray level (e.g., $GLV_{P2}$ described in association with Eq. (1)) of a second pixel of the second image. The second difference may be between the first gray level of the first pixel of the first image and a third gray level (e.g., $GLV_{P3}$ described in association with Eq. (1)) of a third pixel of the third image. The first pixel, the second pixel, and the third pixel may be co-located.

In some embodiments, to determine the gray level of the pixel based on the first difference and the second difference, the gray level of the pixel may be determined (e.g., by image processing system 250 described in association with FIG. 2) as a weighted sum (e.g., $GLV_P$ described in association with Eq. (1)) of the first difference and the second difference. The first difference may be weighted with a first weight value (e.g., parameter a described in association with Eq. (1)). The second difference may be weighted with a second weight value (e.g., parameter b described in association with Eq. (1)). The first weight value and the second weight value may be in a range between zero and one.

FIG. 12 is a flowchart illustrating an example method 1200 for manufacturing an electrostatic holder, consistent with some embodiments of the present disclosure. Method 1200 includes steps 1202-1206.

At step 1202, a mechanical milling process may be applied to a surface (e.g., surface 902 described in association with FIGS. 9-10B) of a gap area (e.g., gap area 908 described in association with FIGS. 9-10B) formed between an outside edge of a sample (e.g., sample 310 described in association with FIGS. 9-10B) held at the electrostatic holder (e.g., sample holder 308 described in association with FIGS. 9-10B) and a structure (e.g., an inner edge) of the electrostatic holder. The finish conditions of the mechanical milling process may include at least one of a rotating milling speed greater than or equal to 4000 rounds per minute, a linear feed lower than or equal to two millimeter per second, or a z-axis cutting feed lower than or equal to 0.03 millimeter. In some embodiments, the surface of the gap area is an aluminum surface.

The electrostatic holder may be configured for generating (e.g., by optical detector 314 described in association with FIGS. 9-10B and image processing system 250 described in association with FIG. 2) an image (e.g., image 1000B described in association with FIG. 10B) based on light reflected off the gap area. The electrostatic holder may be further configured for determining (e.g., by image processing system 250 described in association with FIG. 2) a location of the sample based on the image.

A non-transitory computer readable medium may be provided that stores instructions for a processor (for example, processor of controller 109 of FIG. 1) to carry out image processing (such as some or all steps of method 1100 of FIG. 11 or some or all steps of method 1200 of FIG. 12), data processing, database management, graphical display, operations of an image inspection apparatus or another imaging device, detecting a defect on a sample, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments can further be described using the following clauses:

1. An apparatus for detecting a location of a positioned sample, the apparatus comprising: an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined range of wavelengths, the second wavelength is outside the predetermined range of wavelengths, and the first brightness is higher than the second brightness;

a light source configured to direct the light at the gap area; and an optical detector configured to image the light reflected off the gap area.

2. The apparatus of clause 1, further comprising a polarizing beam splitter configured to polarize the light directed at the gap area with a predetermined polarity.

3. The apparatus of clause 2, wherein the first coating is coated with a second coating configured to modify polarization of the light.

4. The apparatus of clause 1, wherein the first wavelength of the light comprises one of a red light, a blue light, or a green light, and the second wavelength of the light comprises another one of the red light, the blue light, or the green light.

5. The apparatus of clause 4, wherein the first wavelength of the light is a blue light, and the second wavelength of the light is a green light or a red light.

6. The apparatus of clause 1, wherein the light comprises a plurality of wavelengths.

7. The apparatus of clause 6, wherein the light comprises a visible light.

8. The apparatus of clause 6, wherein the light comprises a white light.

9. The apparatus of clause 1, wherein the optical detector is further configured to image the light in a plurality of color channels.

10. The apparatus of clause 9, wherein the plurality of color channels comprises a red channel, a green channel, and a blue channel.

11. The apparatus of clause 1, wherein the first coating is further configured to reflect a third wavelength of the light with third brightness, wherein the third wavelength of the light is outside the predetermined range of wavelengths, and the first brightness is higher than the third brightness.

12. The apparatus of clause 11, wherein the optical detector is further configured to:

image the light reflected off the gap area as a first image in a first color channel, a second image in a second color channel, and a third image in a third color channel, wherein the first wavelength of the light is imaged in the first color channel, the second wavelength of the light is imaged in the second color channel, and the third wavelength of the light is imaged in the third color channel; and wherein the apparatus further comprises circuitry configured to generate a synthesis image based on the first image, the second image, and the third image.

13. The apparatus of clause 12, wherein the apparatus further comprises circuitry configured to: determine a gray level of a pixel based on a first difference and a second difference, wherein the first difference is between a first gray level of a first pixel of the first image and a second gray level of a second pixel of the second image, the second difference is between the first gray level of the first pixel of the first image and a third gray level of a third pixel of the third image, and the first pixel, the second pixel, and the third pixel are co-located; and generate the synthesis image based on the gray level of the pixel.

14. The apparatus of clause 13, wherein the apparatus further comprises circuitry configured to: determine the gray level of the pixel as a weighted sum of the first difference and the second difference, wherein the first difference is weighted with a first weight value, the second difference is weighted with a second weight value, and the first weight value and the second weight value are in a range between zero and one.

15. An apparatus for detecting a location of a positioned sample, the apparatus comprising: an electrostatic holder configured to hold a sample and form a gap area between an outside edge of the sample and a structure of the electrostatic holder when the electrostatic holder holds the sample, wherein a surface of the gap area is applied with a mechanical milling process;

a light source configured to direct the light at the gap area; and an optical detector configured to image the light reflected off the gap area.

16. The apparatus of clause 15, wherein the surface of the gap area is an aluminum surface.

17. The apparatus of clause 16, wherein finish conditions of the mechanical milling process comprise at least one of a rotating milling speed greater than or equal to 4000 rounds per minute, a linear feed lower than or equal to two millimeter per second, or a z-axis cutting feed lower than or equal to 0.03 millimeter.

18. A system, comprising:

an image inspection apparatus configured to scan a sample positioned on a sample holder and generate an image of the sample;

an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined range of wavelengths, the second wavelength is outside the predetermined range of wavelengths, and the first brightness is higher than the second brightness, and a light source configured to direct the light at the gap area with a predetermined polarity; and an optical detector configured to image the light reflected off the gap area, wherein brightness of the first wavelength of the imaged light is higher than brightness of the second wavelength of the imaged light.

19. A system, comprising:

an image inspection apparatus configured to scan a sample positioned on a sample holder and generate an image of the sample;

an electrostatic holder configured to hold a sample and form a gap area between an outside edge of the sample and a structure of the electrostatic holder when the electrostatic holder holds the sample, wherein a surface of the gap area is applied with a mechanical milling process;

a light source configured to direct the light at the gap area with a predetermined polarity; and an optical detector configured to image the light reflected off the gap area.

20. A method for detecting a location of a positioned sample, the method comprising:

obtaining light reflected off a gap area formed between an outside edge of a sample held at an electrostatic holder and a structure of the electrostatic holder, wherein the gap area is coated with a first coating configured to reflect a first wavelength of light with first brightness, to reflect a second wavelength of the light with second brightness, and to reflect a third wavelength of the light with third brightness, the first wavelength is within a predetermined range of wavelengths, the second wavelength and the third wavelength are outside the predetermined range of wavelengths, and the first brightness is higher than the second brightness and the third brightness;

imaging the light as a first image in a first color channel, a second image in a second color channel, and a third image in a third color channel, wherein a first wavelength of the light is imaged in the first color channel, a second wavelength of the light is imaged in the second color channel, and a third wavelength of the light is imaged in the third color channel;

generating a synthesis image based on the first image, the second image, and the third image; and determining a location of the sample based on the synthesis image.

21. The method of clause 20, wherein generating the synthesis image based on the first image, the second image, and the third image comprises:

determining a gray level of a pixel based on a first difference and a second difference, wherein the first difference is between a first gray level of a first pixel of the first image and a second gray level of a second pixel of the second image, the second difference is between the first gray level of the first pixel of the first image and a third gray level of a third pixel of the third image, and the first pixel, the second pixel, and the third pixel are co-located.

22. The method of clause 21, wherein determining the gray level of the pixel based on the first difference and the second difference comprises:

determining the gray level of the pixel as a weighted sum of the first difference and the second difference, wherein the first difference is weighted with a first weight value, the second difference is weighted with a second weight value, and the first weight value and the second weight value are in a range between zero and one.

23. The method of clause 21, wherein the first coating is coated with a second coating configured to modify polarization of the light.

24. The method of clause 21, wherein the first wavelength of the light, the second wavelength of the light, and the third wavelength of the light comprise a red light, a blue light, and a green light.

25. The method of clause 21, the light comprises a plurality of wavelengths.

26. The method of clause 25, wherein the light comprises a visible light.

27. The method of clause 25, wherein the light comprises a white light.

28. The method of clause 21, wherein the first color channel is a blue channel, the second color channel is a red channel, and the third channel is a green channel.

29. A non-transitory computer-readable medium that stores a set of instructions that is executable by at least one processor of an apparatus to cause the apparatus to perform a method, the method comprising:

causing the apparatus to obtain light reflected off a gap area formed between an outside edge of a sample held at an electrostatic holder and a structure of the electrostatic holder, wherein the gap area is coated with a first coating configured to reflect a first wavelength of light with first brightness, to reflect a second wavelength of the light with second brightness, and to reflect a third wavelength of the light with third brightness, the first wavelength is within a predetermined range of wavelengths, the second wavelength and the third wavelength are outside the predetermined range of wavelengths, and the first brightness is higher than the second brightness and the third brightness;

causing the apparatus to image the light as a first image in a first color channel, a second image in a second color channel, and a third image in a third color channel, wherein a first wavelength of the light is imaged in the first color channel, a second wavelength of the light is imaged in the second color channel, and a third wavelength of the light is imaged in the third color channel;

generating a synthesis image based on the first image, the second image, and the third image; and determining a location of the sample based on the synthesis image.

30. The non-transitory computer-readable medium of clause 29, wherein generating the synthesis image based on the first image, the second image, and the third image comprises:

determining a gray level of a pixel based on a first difference and a second difference, wherein the first difference is between a first gray level of a first pixel of the first image and a second gray level of a second pixel of the second image, the second difference is between the first gray level of the first pixel of the first image and a third gray level of a third pixel of the third image, and the first pixel, the second pixel, and the third pixel are co-located.

31. The non-transitory computer-readable medium of clause 30, wherein determining the gray level of the pixel based on the first difference and the second difference comprises:

determining the gray level of the pixel as a weighted sum of the first difference and the second difference, wherein the first difference is weighted with a first weight value, the second difference is weighted with a second weight value, and the first weight value and the second weight value are in a range between zero and one.

32. The non-transitory computer-readable medium of clause 29, wherein the first coating is coated with a second coating configured to modify polarization of the light.

33. The non-transitory computer-readable medium of clause 29, wherein the first wavelength of the light, the second wavelength of the light, and the third wavelength of the light comprise a red light, a blue light, and a green light.

34. The non-transitory computer-readable medium of clause 29, wherein the light comprises a plurality of wavelengths.

35. The non-transitory computer-readable medium of clause 34, wherein the light comprises a visible light.

36. The non-transitory computer-readable medium of clause 34, wherein the light comprises a white light.

37. The non-transitory computer-readable medium of clause 29, wherein the first color channel is a blue channel, the second color channel is a red channel, and the third channel is a green channel.

38. A method for manufacturing an electrostatic holder, the method comprising:

applying a mechanical milling process to a surface of a gap area formed between an outside edge of a sample held at the electrostatic holder and a structure of the electrostatic holder, wherein finish conditions of the mechanical milling process comprise at least one of a rotating milling speed greater than or equal to 4000 rounds per minute, a linear feed lower than or equal to two millimeter per second, or a z-axis cutting feed lower than or equal to 0.03 millimeter, and wherein the electrostatic holder is configured for:

generating an image based on light reflected off the gap area; and determining a location of the sample based on the image.

39. The method of clause 38, wherein the surface of the gap area is an aluminum surface.

The block diagrams in the figures illustrate the architecture, functionality, and operation of possible implementations of systems, methods, and computer hardware or software products according to various example embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:

1. An apparatus for detecting a location of a positioned sample, the apparatus comprising:

an electrostatic holder configured to hold a sample and form a gap area between an outside edge of the sample and a structure of the electrostatic holder when the electrostatic holder holds the sample, wherein the gap area is coated with a first coating configured to reflect a first wavelength of light with first brightness and to reflect a second wavelength of the light with second brightness, the first wavelength is within a predetermined range of wavelengths, the second wavelength is outside the predetermined range of wavelengths, and the first brightness is higher than the second brightness;

a light source configured to direct the light at the gap area; and an optical detector configured to image the light reflected off the gap area.

2. The apparatus of claim 1, further comprising a polarizing beam splitter configured to polarize the light directed at the gap area with a predetermined polarity.

3. The apparatus of claim 2, wherein the first coating is coated with a second coating configured to modify polarization of the light.

4. The apparatus of claim 1, wherein the first wavelength of the light comprises one of a red light, a blue light, or a green light, and the second wavelength of the light comprises another one of the red light, the blue light, or the green light.

5. The apparatus of claim 4, wherein the first wavelength of the light is a blue light, and the second wavelength of the light is a green light or a red light.

6. The apparatus of claim 1, wherein the light comprises a plurality of wavelengths.

7. The apparatus of claim 6, wherein the light comprises a visible light.

8. The apparatus of claim 6, wherein the light comprises a white light.

9. The apparatus of claim 1, wherein the optical detector is further configured to image the light in a plurality of color channels.

10. The apparatus of claim 9, wherein the plurality of color channels comprises a red channel, a green channel, and a blue channel.

11. The apparatus of claim 1, wherein the first coating is further configured to reflect a third wavelength of the light with third brightness, wherein the third wavelength of the light is outside the predetermined range of wavelengths, and the first brightness is higher than the third brightness.

12. The apparatus of claim 11, wherein the optical detector is further configured to:

image the light reflected off the gap area as a first image in a first color channel, a second image in a second color channel, and a third image in a third color channel, wherein the first wavelength of the light is imaged in the first color channel, the second wavelength of the light is imaged in the second color channel, and the third wavelength of the light is imaged in the third color channel; and wherein the apparatus further comprises circuitry configured to generate a synthesis image based on the first image, the second image, and the third image.

13. The apparatus of claim 12, wherein the apparatus further comprises circuitry configured to:

determine a gray level of a pixel based on a first difference and a second difference, wherein the first difference is between a first gray level of a first pixel of the first image and a second gray level of a second pixel of the second image, the second difference is between the first gray level of the first pixel of the first image and a third gray level of a third pixel of the third image, and the first pixel, the second pixel, and the third pixel are co-located; and generate the synthesis image based on the gray level of the pixel.

14. The apparatus of claim 13, wherein the apparatus further comprises circuitry configured to:

determine the gray level of the pixel as a weighted sum of the first difference and the second difference, wherein the first difference is weighted with a first weight value, the second difference is weighted with a second weight value, and the first weight value and the second weight value are in a range between zero and one.

15. A non-transitory computer-readable medium that stores a set of instructions that is executable by at least one processor of an apparatus to cause the apparatus to perform a method, the method comprising:

causing the apparatus to obtain light reflected off a gap area formed between an outside edge of a sample held at an electrostatic holder and a structure of the electrostatic holder, wherein the gap area is coated with a first coating configured to reflect a first wavelength of light with first brightness, to reflect a second wavelength of the light with second brightness, and to reflect a third wavelength of the light with third brightness, the first wavelength is within a predetermined range of wavelengths, the second wavelength and the third wavelength are outside the predetermined range of wavelengths, and the first brightness is higher than the second brightness and the third brightness;

causing the apparatus to image the light as a first image in a first color channel, a second image in a second color channel, and a third image in a third color channel, wherein a first wavelength of the light is imaged in the first color channel, a second wavelength of the light is imaged in the second color channel, and a third wavelength of the light is imaged in the third color channel;

generating a synthesis image based on the first image, the second image, and the third image; and determining a location of the sample based on the synthesis image.

16. The non-transitory computer-readable medium of claim 15, wherein generating the synthesis image based on the first image, the second image, and the third image comprises:

determining a gray level of a pixel based on a first difference and a second difference, wherein the first difference is between a first gray level of a first pixel of the first image and a second gray level of a second pixel of the second image, the second difference is between the first gray level of the first pixel of the first image and a third gray level of a third pixel of the third image, and the first pixel, the second pixel, and the third pixel are co-located.

17. The non-transitory computer-readable medium of claim 16, wherein determining the gray level of the pixel based on the first difference and the second difference comprises:

determining the gray level of the pixel as a weighted sum of the first difference and the second difference, wherein the first difference is weighted with a first weight value, the second difference is weighted with a second weight value, and the first weight value and the second weight value are in a range between zero and one.

18. The non-transitory computer-readable medium of claim 15, wherein the first coating is coated with a second coating configured to modify polarization of the light.

19. The non-transitory computer-readable medium of claim 15, wherein the first wavelength of the light, the second wavelength of the light, and the third wavelength of the light comprise a red light, a blue light, and a green light.

20. A system, comprising:

an image inspection apparatus configured to scan a sample positioned on a sample holder and generate an image of the sample;

an electrostatic holder configured to hold a sample and form a gap area between an outside edge of the sample and a structure of the electrostatic holder when the electrostatic holder holds the sample, wherein a surface of the gap area is applied with a mechanical milling process;

a light source configured to direct the light at the gap area with a predetermined polarity; and an optical detector configured to image the light reflected off the gap area.

* * * * *